US012642108B2

(12) United States Patent
Kang et al.

(10) Patent No.: US 12,642,108 B2
(45) Date of Patent: May 26, 2026

(54) SEMICONDUCTOR PACKAGE

(71) Applicant: LG INNOTEK CO., LTD., Seoul (KR)

(72) Inventors: Tae Gyu Kang, Seoul (KR); Dong Keon Lee, Seoul (KR); Won Suk Jung, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 354 days.

(21) Appl. No.: 18/284,028

(22) PCT Filed: Mar. 25, 2022

(86) PCT No.: PCT/KR2022/004238
§ 371 (c)(1),
(2) Date: Sep. 25, 2023

(87) PCT Pub. No.: WO2022/203458
PCT Pub. Date: Sep. 29, 2022

(65) Prior Publication Data
US 2024/0021524 A1     Jan. 18, 2024

(30) Foreign Application Priority Data

Mar. 25, 2021     (KR) ........................ 10-2021-0038864

(51) Int. Cl.
*H01L 23/495*     (2006.01)
*H10B 80/00*     (2023.01)
(Continued)

(52) U.S. Cl.
CPC .......... *H10W 70/611* (2026.01); *H10B 80/00* (2023.02); *H10W 70/685* (2026.01);
(Continued)

(58) Field of Classification Search
CPC ............. H01L 23/5383; H01L 25/0657; H01L 2225/06506; H01L 2225/0651;
(Continued)

(56) References Cited

U.S. PATENT DOCUMENTS 10,028,393 B2     7/2018   Shimizu et al.
10,863,918 B2 *   12/2020  Du .......................... A61B 5/055
(Continued)

FOREIGN PATENT DOCUMENTS

JP          2016-18858 A      2/2016
KR     10-2017-0079388 A      7/2017
(Continued)

*Primary Examiner* — Theresa T Doan
(74) *Attorney, Agent, or Firm* — Birch, Stewart, Kolasch & Birch, LLP

(57)     ABSTRACT

A semiconductor package according to an embodiment includes a first substrate layer; and a second substrate layer disposed on the first substrate layer, wherein the first substrate layer includes at least one first insulating layer; a first circuit pattern disposed on the first insulating layer; and a first via passing through the first insulating layer and connected to the first circuit pattern, wherein the second substrate layer includes a second insulating layer disposed on the first insulating layer; a second circuit pattern disposed on the second insulating layer; and a second via passing through the second insulating layer and connected to the second circuit pattern, wherein the first insulating layer and the second insulating layer include different insulating materials and wherein a width of the first via is different from a width of the second via.

18 Claims, 20 Drawing Sheets

(51) Int. Cl.

| | |
|---|---|
| *H10W 70/60* | (2026.01) |
| *H10W 70/685* | (2026.01) |
| *H10W 90/00* | (2026.01) |
| *H10W 90/28* | (2026.01) |

(52) U.S. Cl.
CPC ............ *H10W 90/00* (2026.01); *H10W 90/28* (2026.01); *H10W 90/752* (2026.01); *H10W 90/754* (2026.01)

(58) Field of Classification Search
CPC ....... H01L 2225/06568; H01L 21/4857; H01L 23/49816; H01L 25/18; H01L 23/49838; H01L 23/49822; H01L 25/105; H01L 2224/16225; H01L 2224/32145; H01L 2224/32225; H01L 2224/48091; H01L 2224/48145; H01L 2224/48227; H01L 2224/73204; H01L 2224/73265; H01L 2224/81; H01L 2924/15311; H01L 23/00; H01L 23/49894; H01L 23/5386; H01L 24/06; H01L 2224/0603; H10B 80/00

USPC .......................................................... 257/668
See application file for complete search history.

(56) References Cited

U.S. PATENT DOCUMENTS

| | | | | |
|---|---|---|---|---|
| 10,881,004 | B1 | 12/2020 | Lee et al. | |
| 2014/0041923 | A1 | 2/2014 | Hisada et al. | |
| 2016/0374198 | A1* | 12/2016 | Kim ..................... | H05K 1/0271 |
| 2019/0380210 | A1 | 12/2019 | Lin et al. | |
| 2020/0083137 | A1 | 3/2020 | Park et al. | |
| 2021/0076492 | A1 | 3/2021 | Min et al. | |
| 2021/0242117 | A1* | 8/2021 | Hung ..................... | H01L 21/56 |

FOREIGN PATENT DOCUMENTS

| | | |
|---|---|---|
| KR | 10-2018-0036871 A | 4/2018 |
| KR | 10-2020-0069573 A | 6/2020 |
| KR | 10-2020-0132511 A | 11/2020 |
| KR | 10-2021-0030733 A | 3/2021 |
| KR | 10-2021-0031304 A | 3/2021 |

* cited by examiner

【FIG. 1】
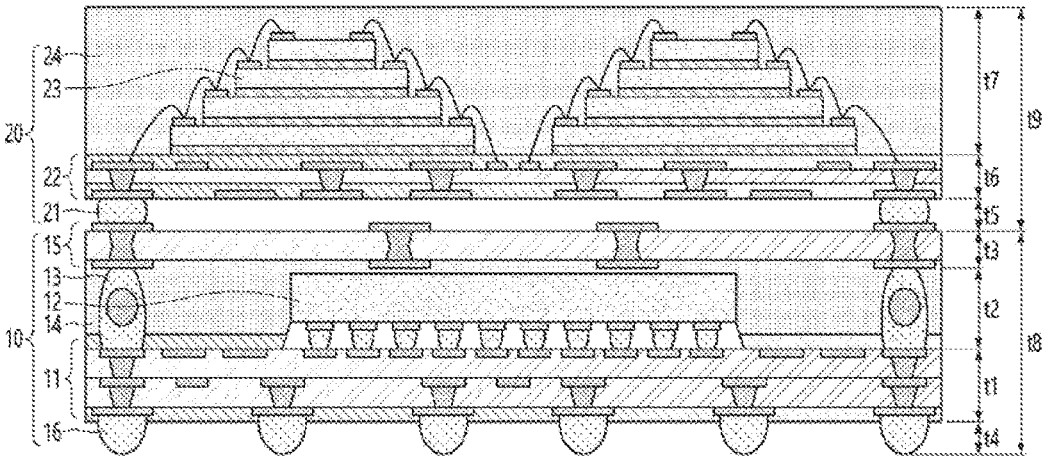
【FIG. 2】
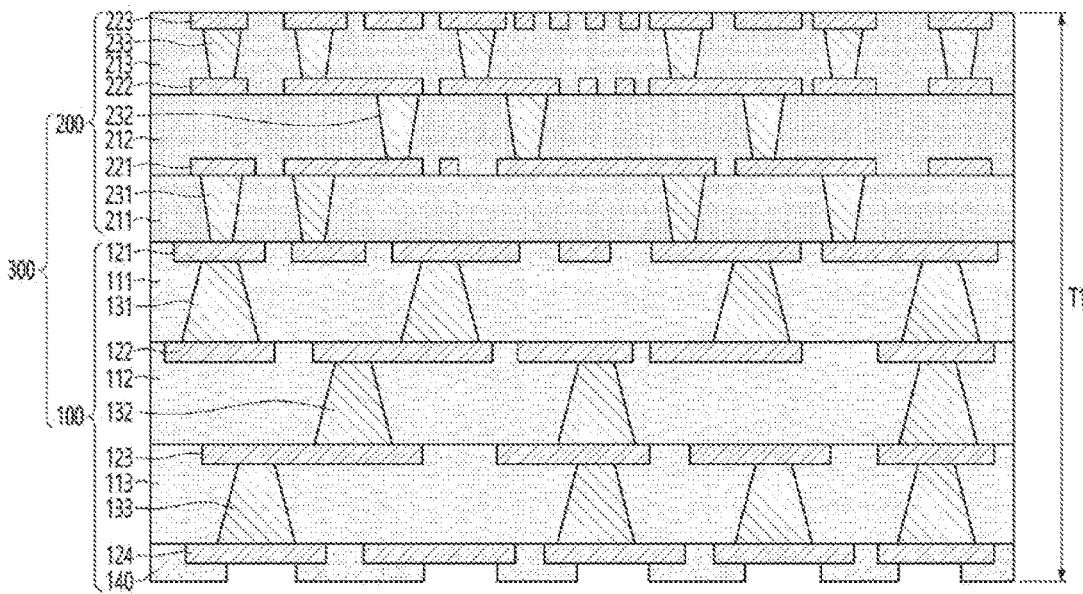

【FIG. 3】
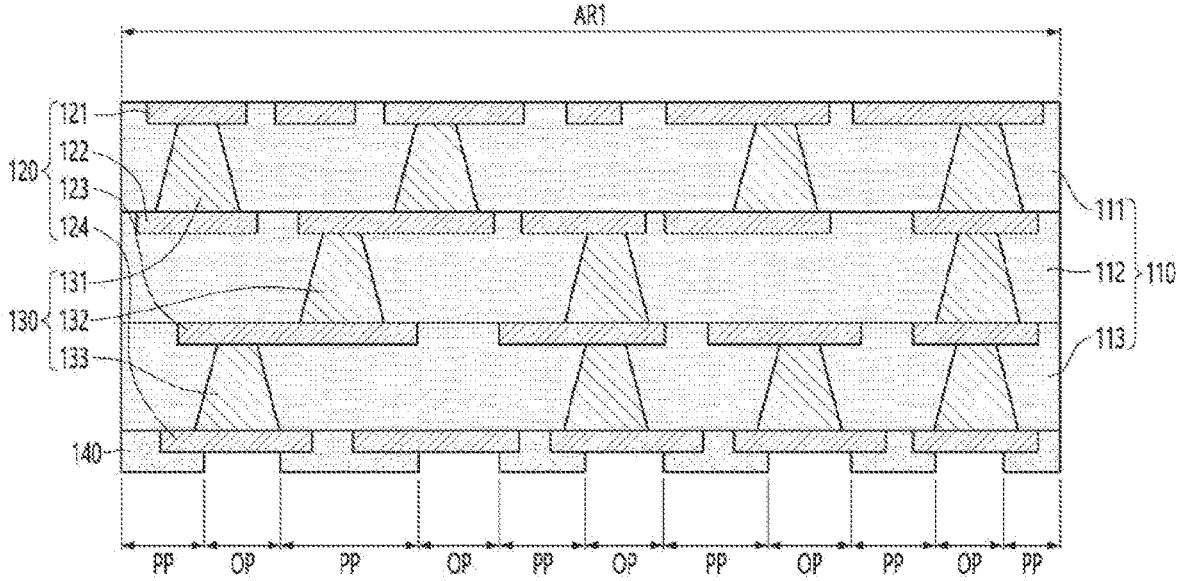
【FIG. 4】
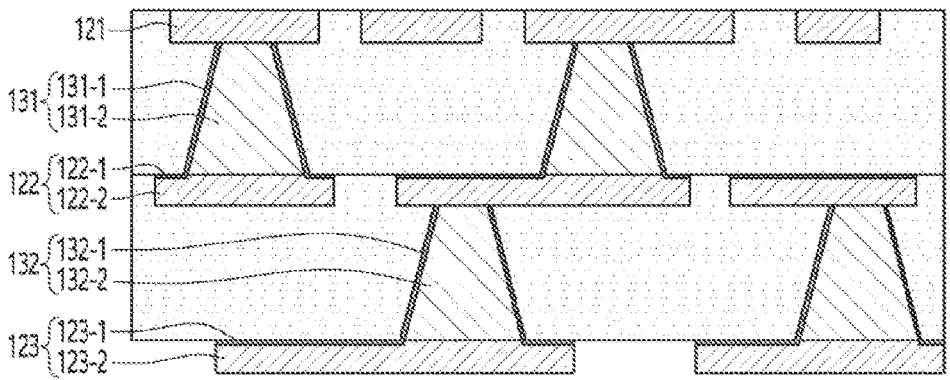

【FIG. 5】
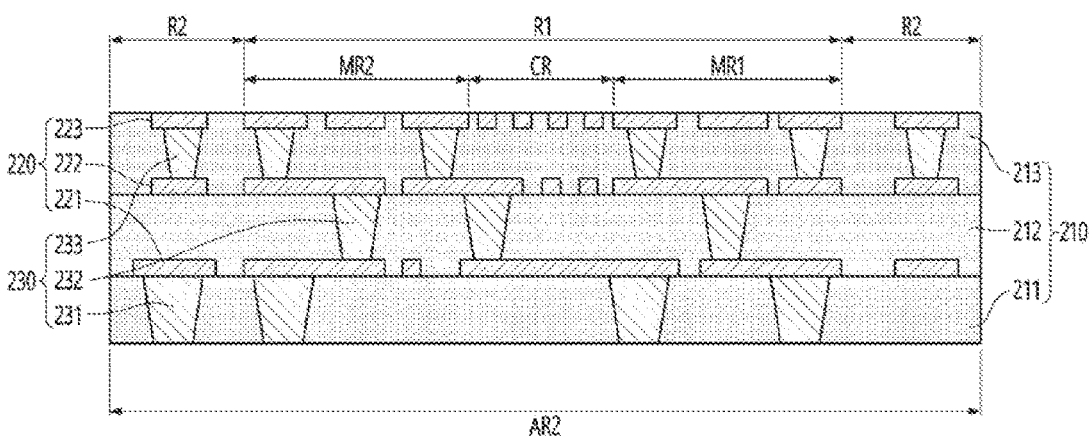
【FIG. 6】
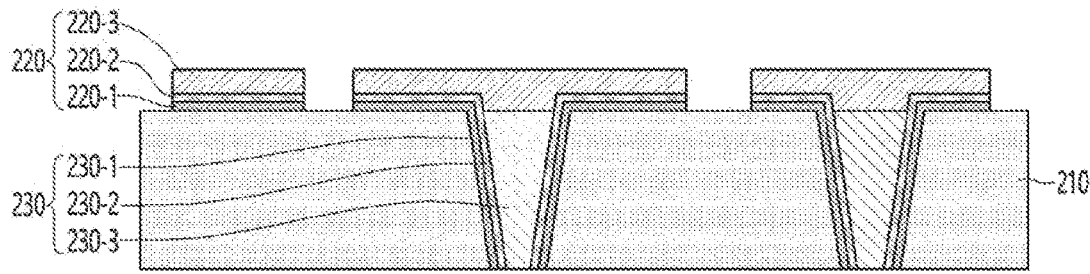

【FIG. 7】
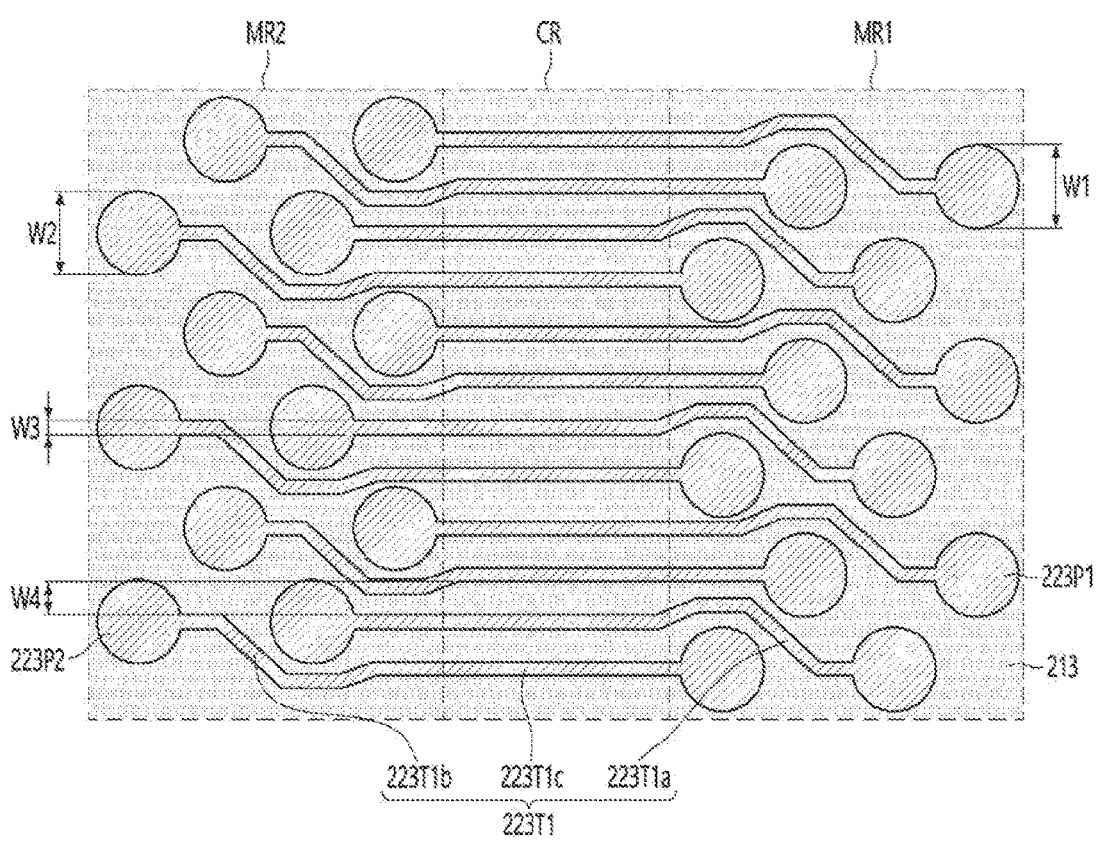

【FIG. 8】
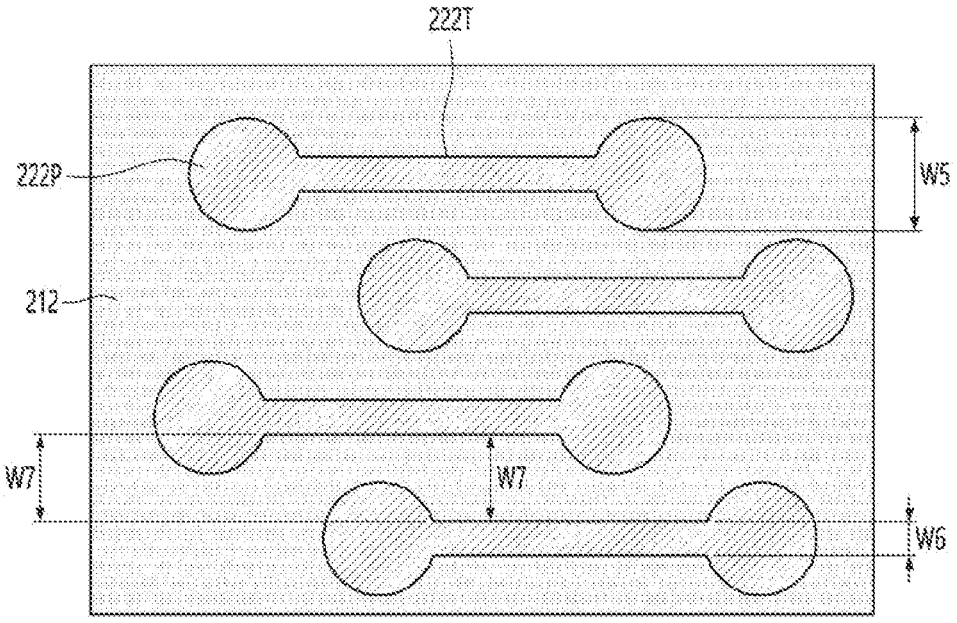
【FIG. 9】
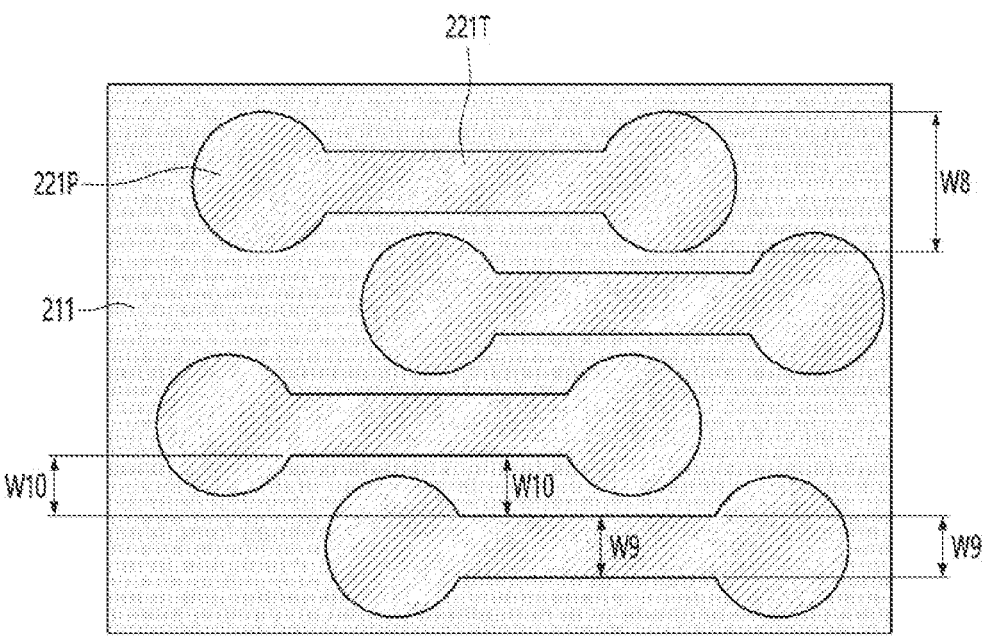

【FIG. 10】
【FIG. 11】
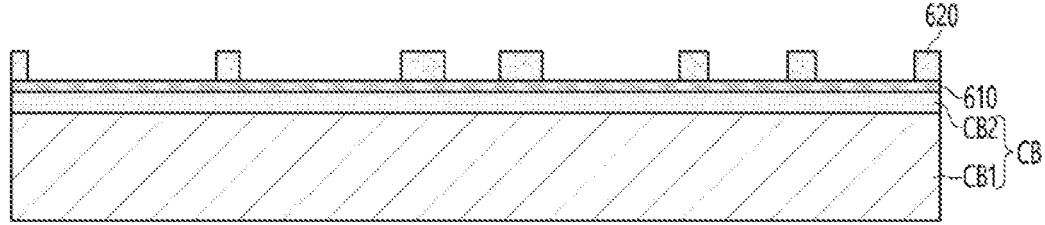
【FIG. 12】
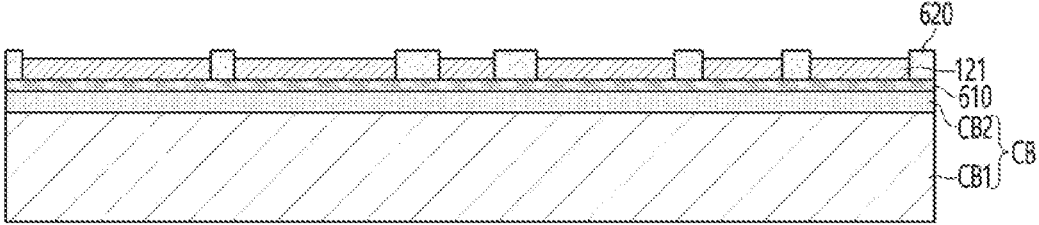
【FIG. 13】
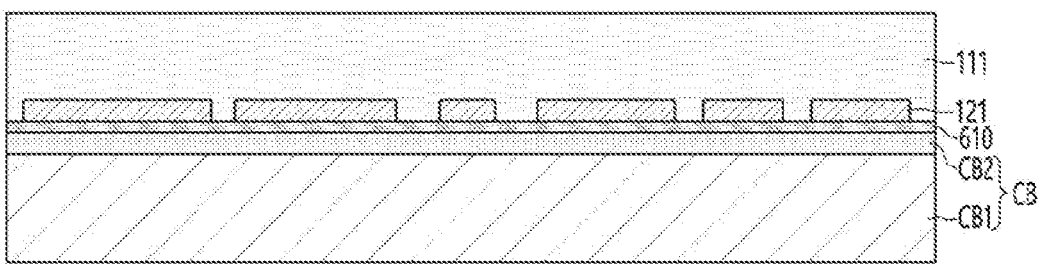

【FIG. 14】
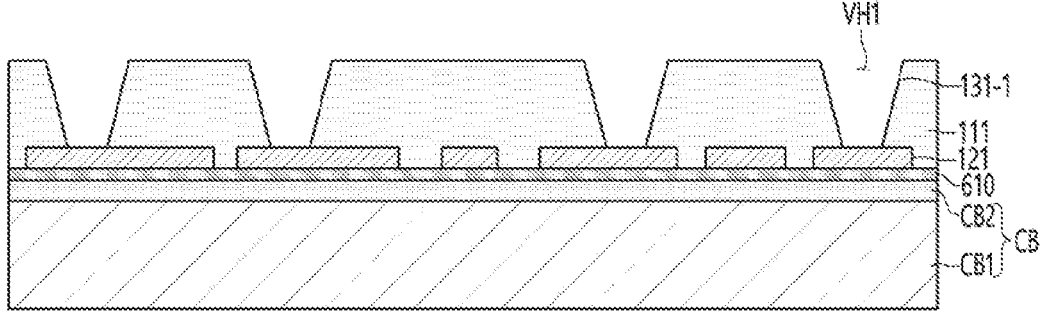
【FIG. 15】
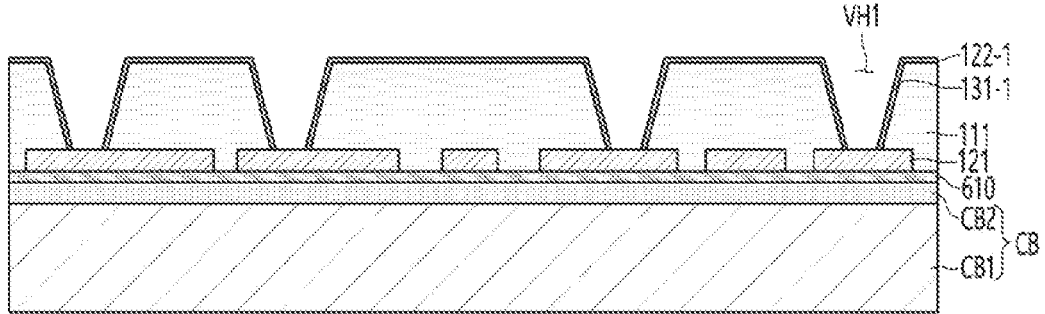
【FIG. 16】
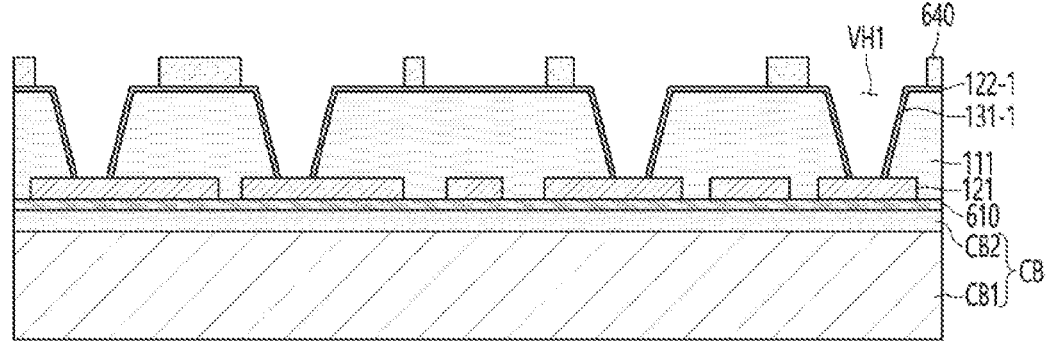

【FIG. 17】
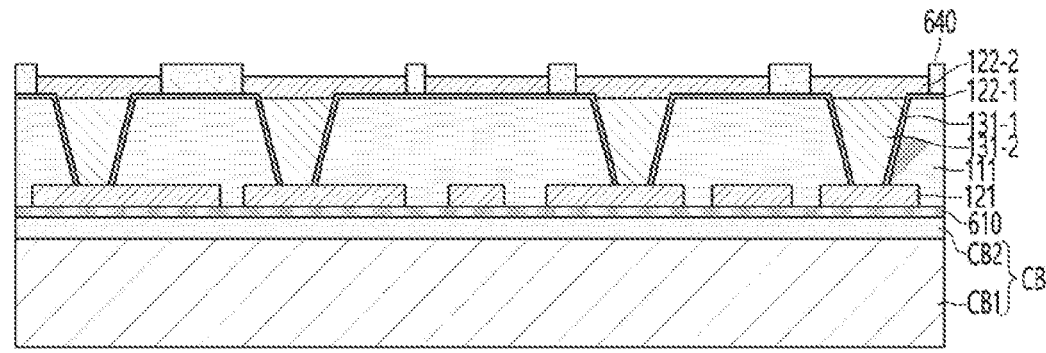
【FIG. 18】
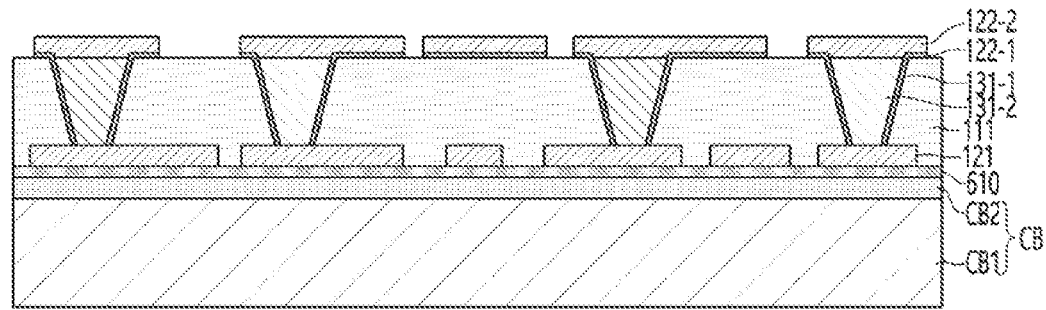

[FIG. 19]
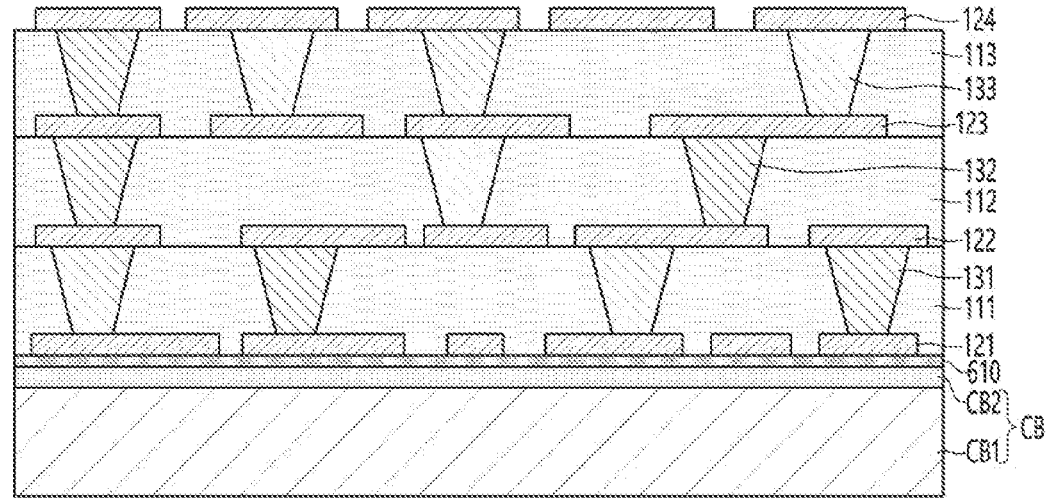
[FIG. 20]
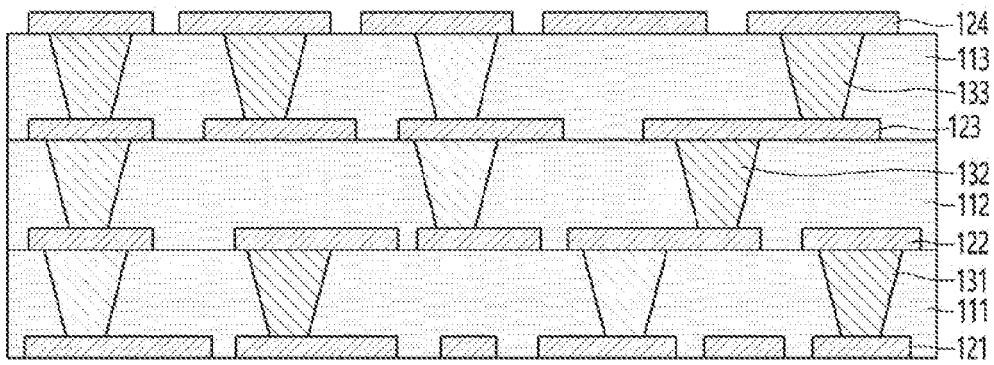

[FIG. 21]
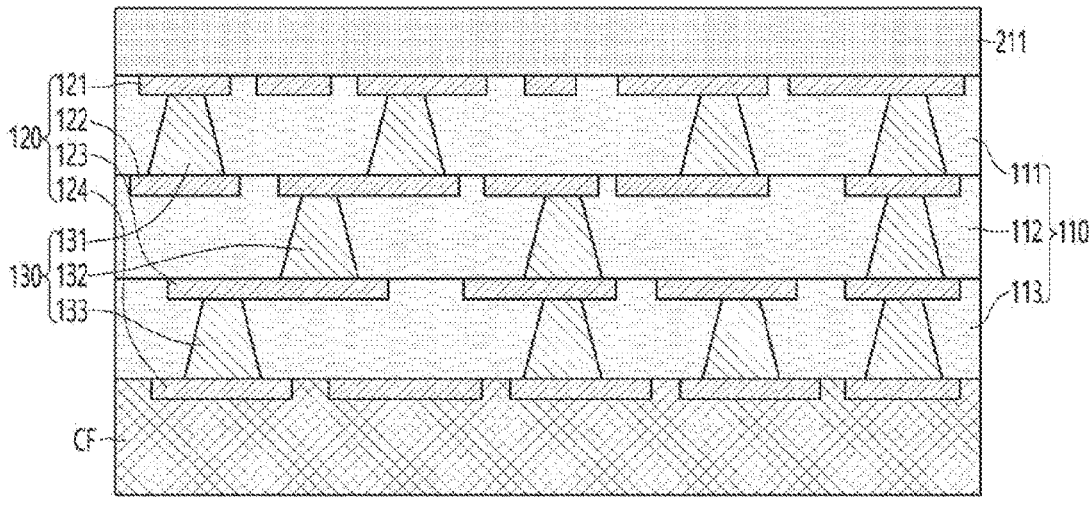
[FIG. 22]
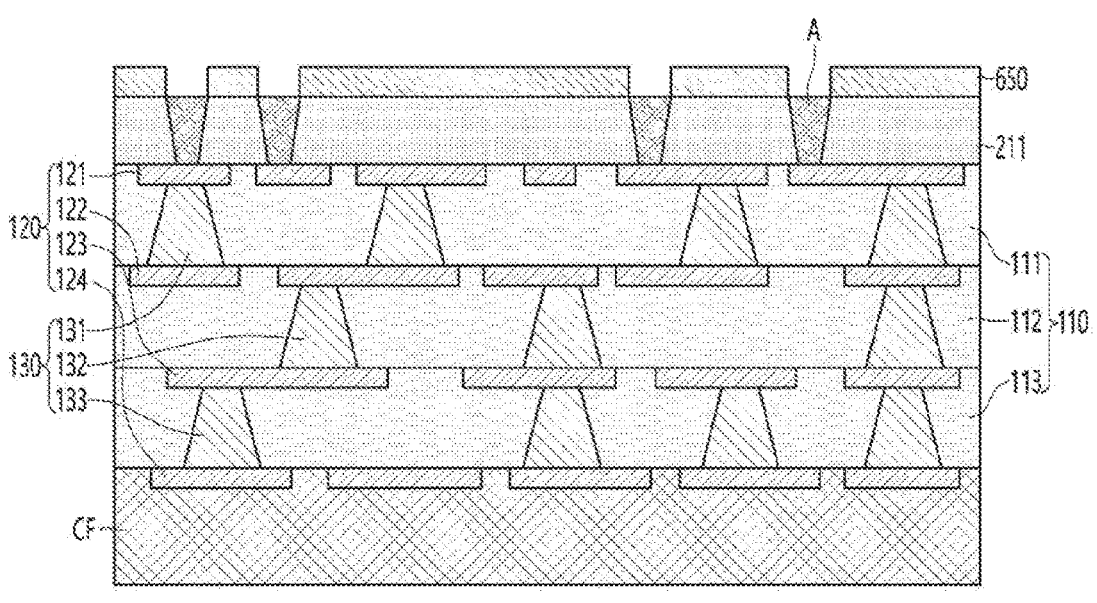

【FIG. 23】
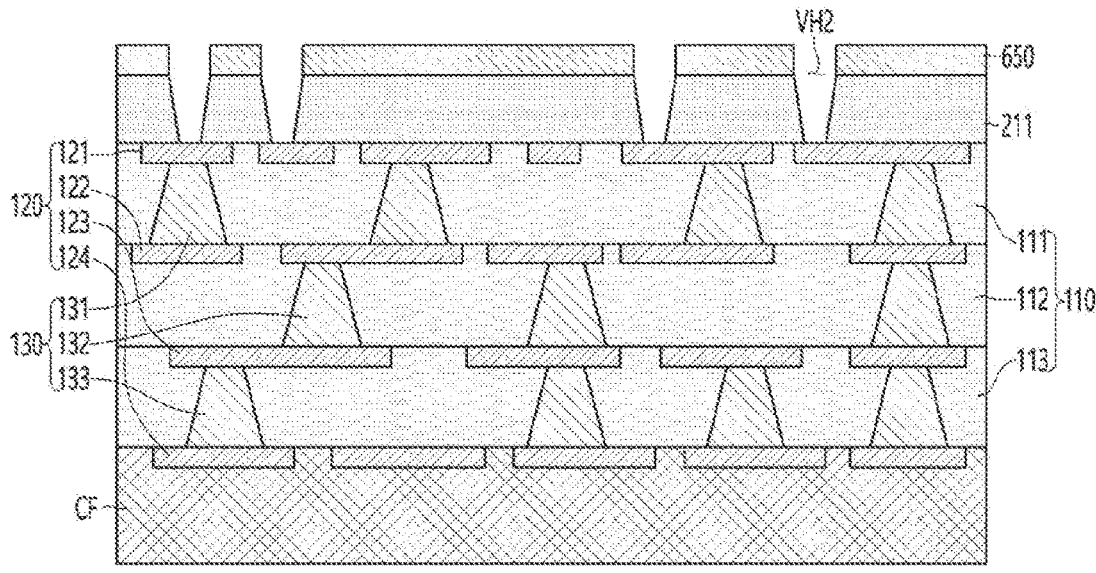
【FIG. 24】
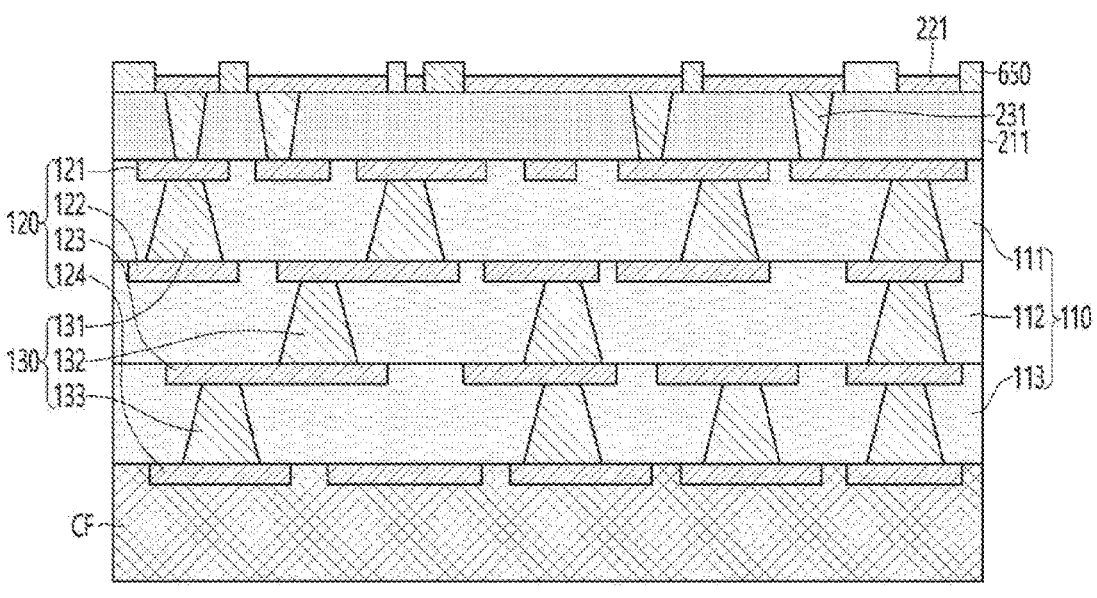

[FIG. 25]
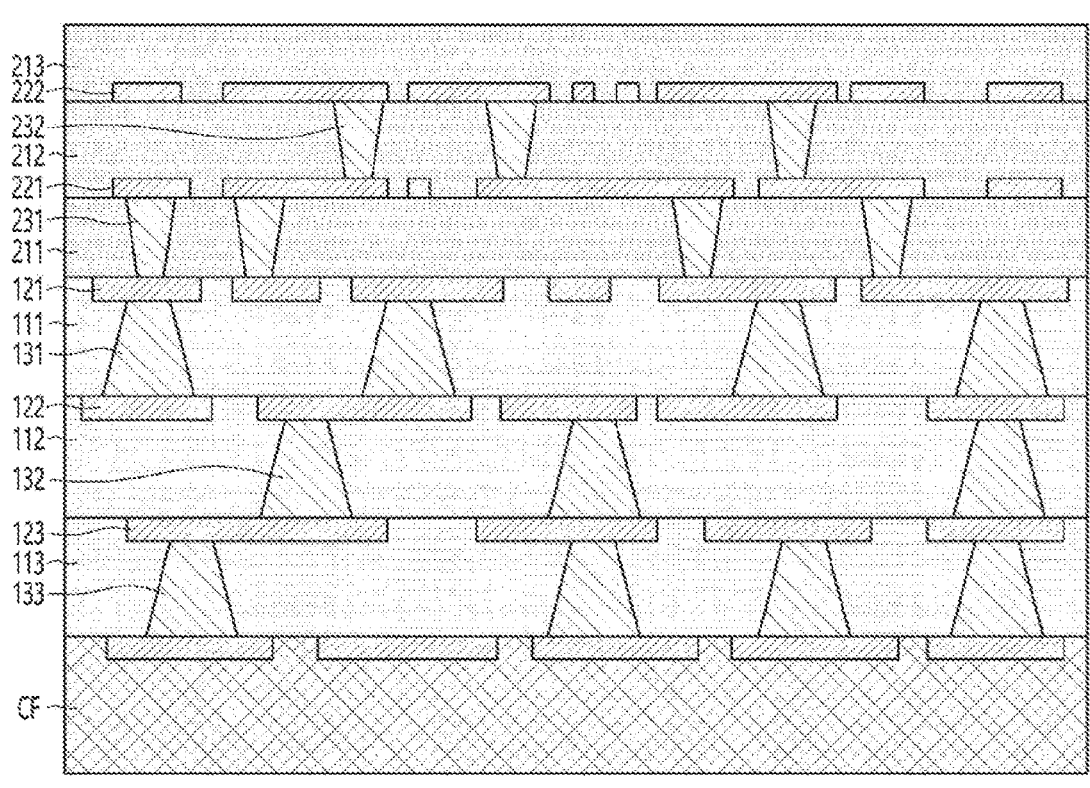

[FIG. 26]
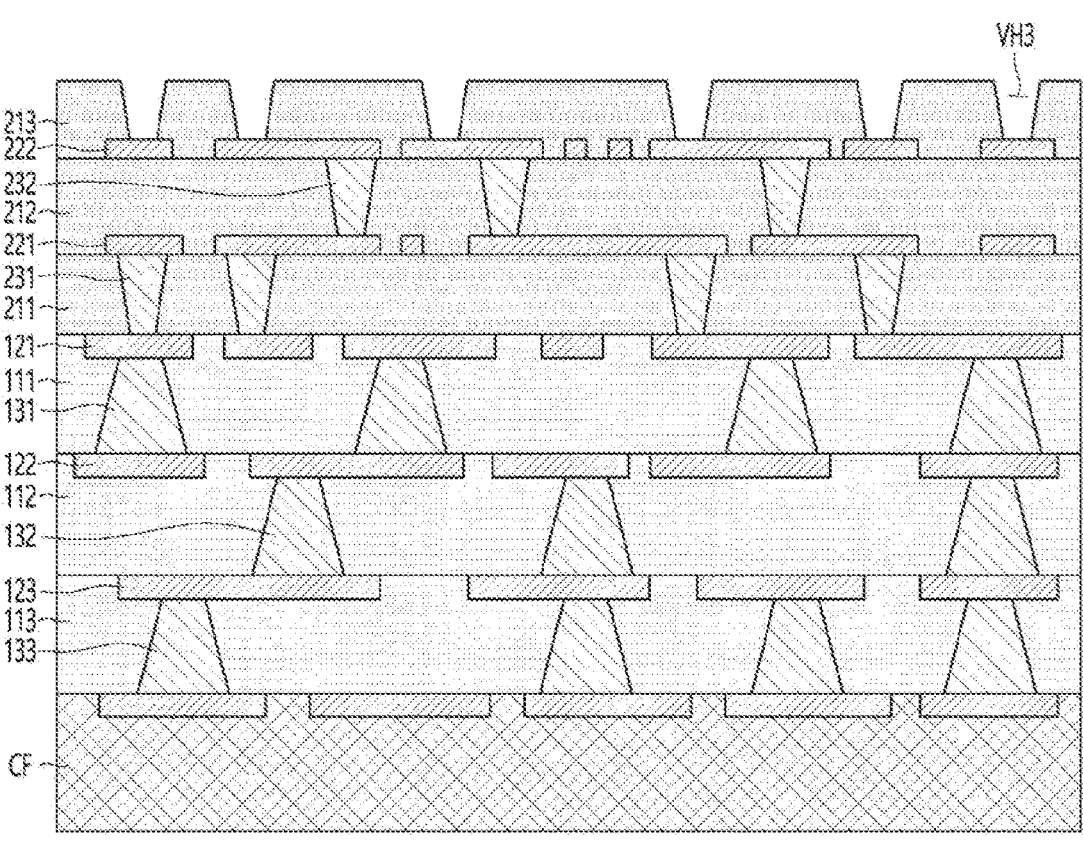

【FIG. 27】
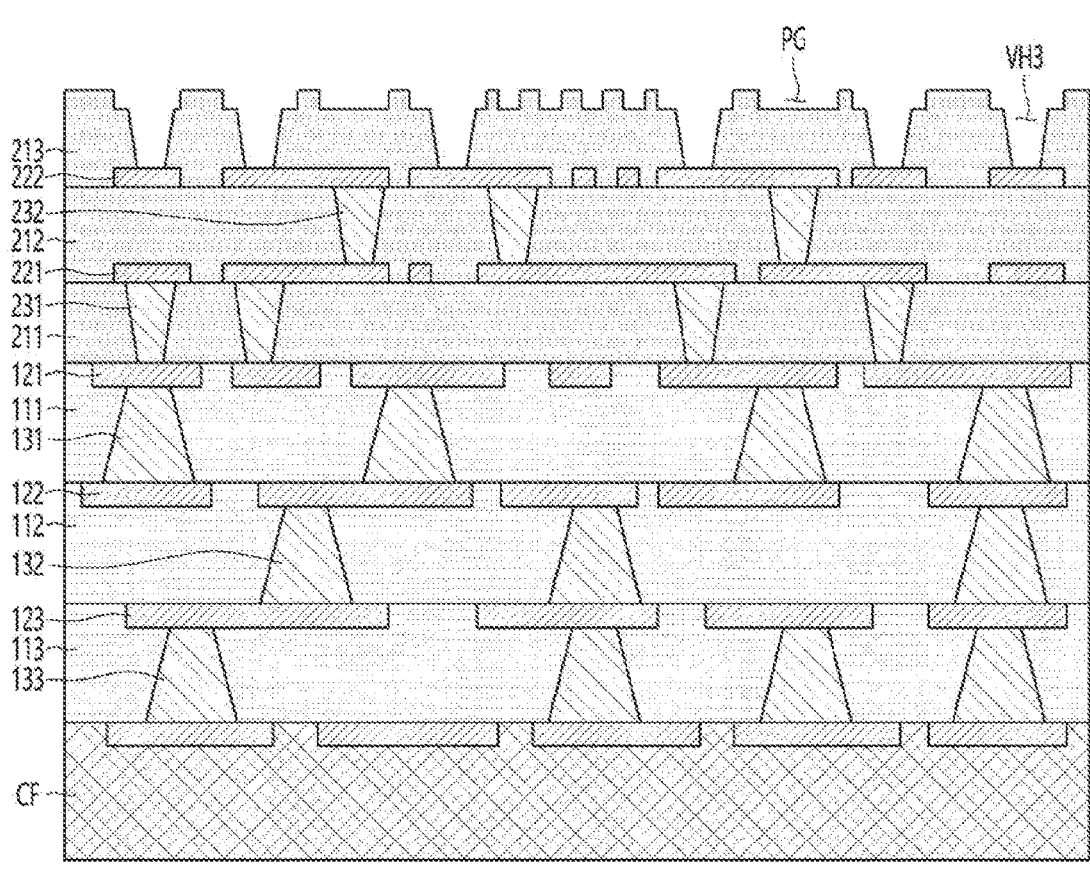

[FIG. 28]
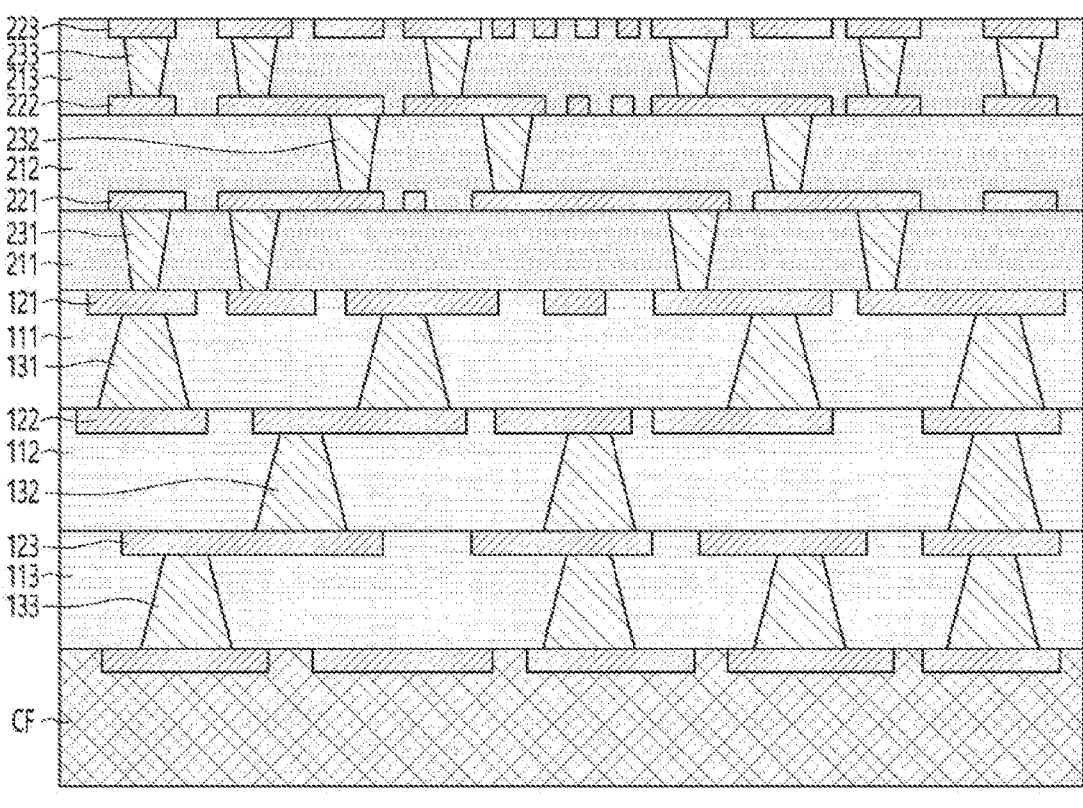

[FIG. 29]
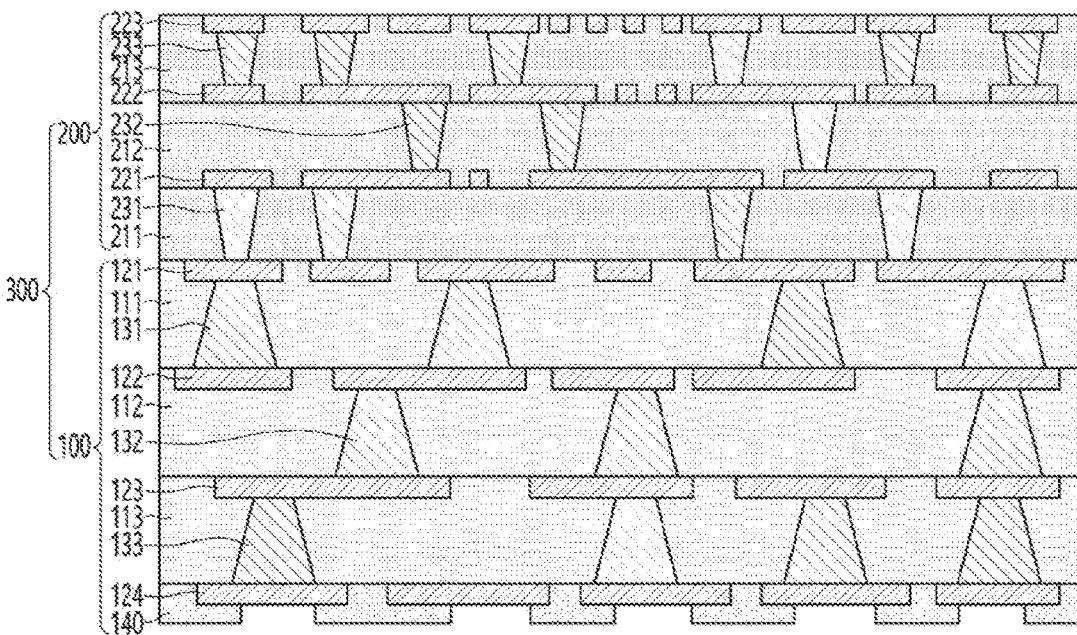

[FIG. 30]
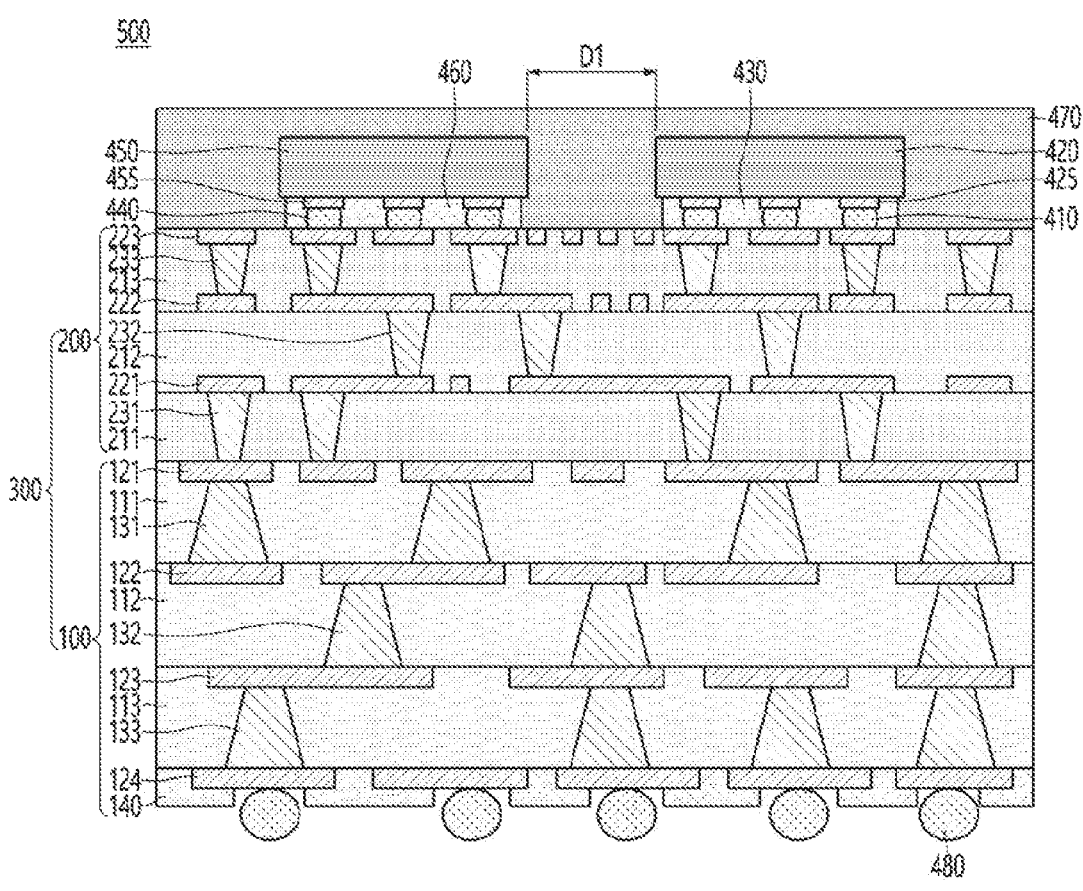

[FIG. 31]
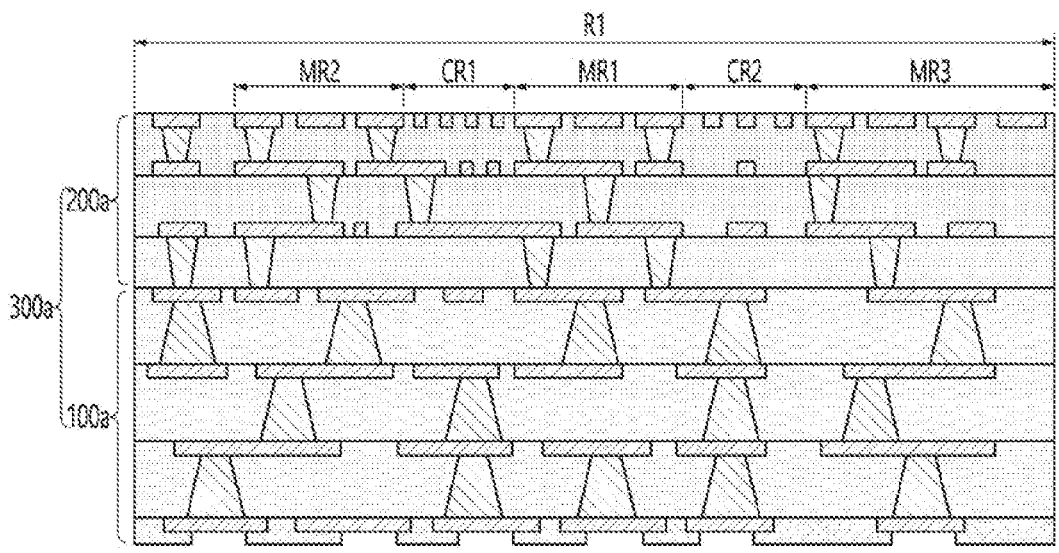
[FIG. 32]
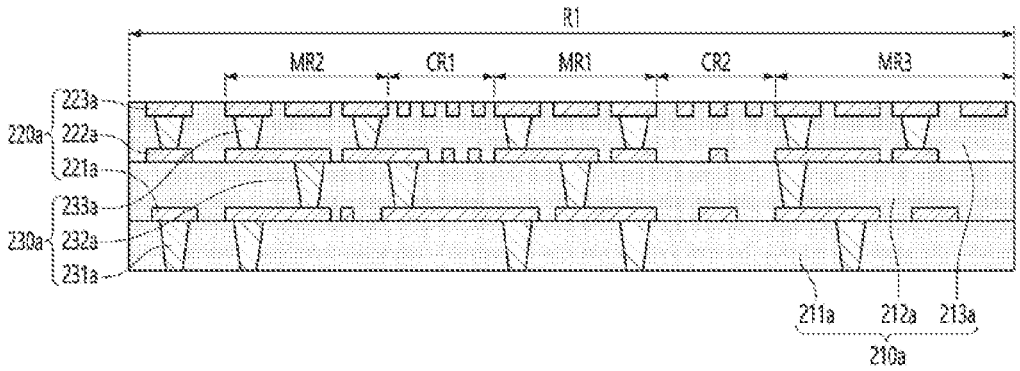

[FIG. 33]
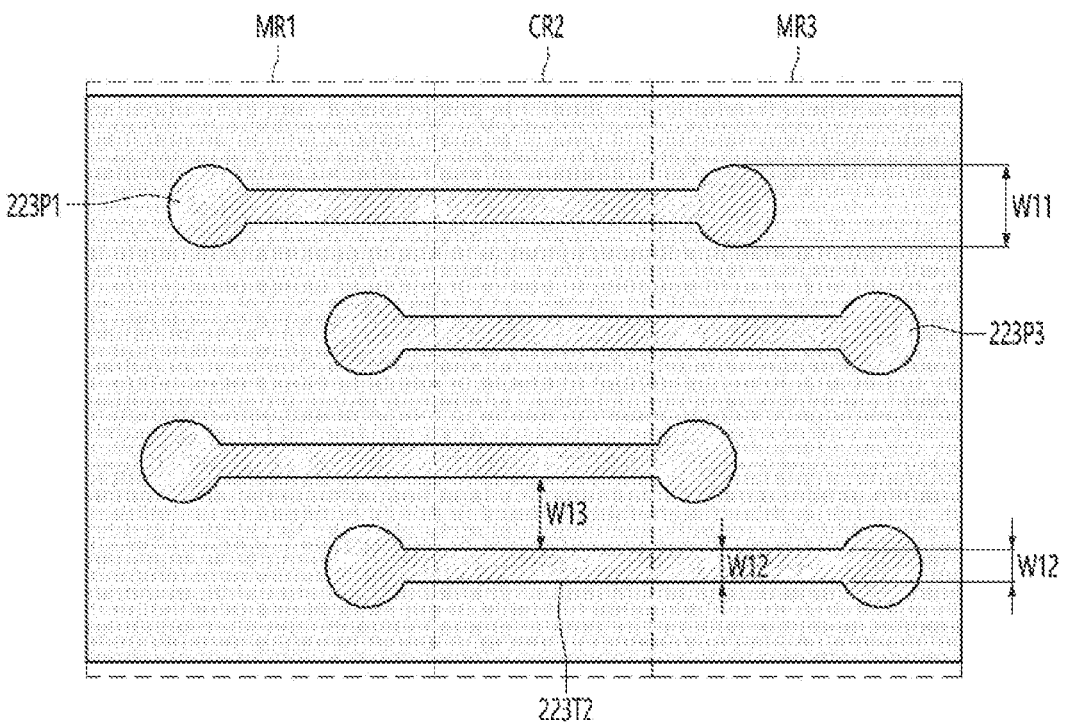

【FIG. 34】
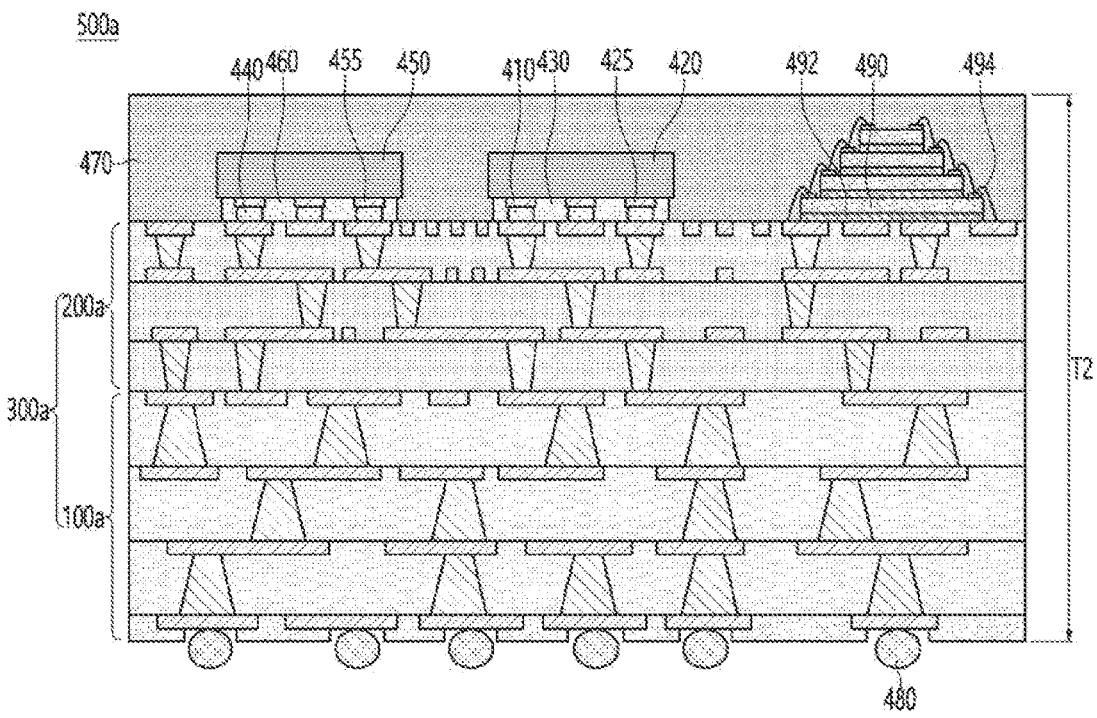

SEMICONDUCTOR PACKAGE

CROSS REFERENCE TO RELATED APPLICATIONS

This application is the National Phase of PCT International Application No. PCT/KR2022/004238, filed on Mar. 25, 2022, which claims priority under 35 U.S.C. 119(a) to Patent Application No. 10-2021-0038864, filed in Republic of Korea on Mar. 25, 2021, all of which are hereby expressly incorporated by reference into the present application.

TECHNICAL FIELD

An embodiment relates to a semiconductor package.

BACKGROUND ART

Higher performance of electric/electronic products is progressing, and accordingly, technologies for attaching a larger number of packages to a substrate of a limited size are being proposed and researched. However, a general package is based on mounting one semiconductor device, and thus, there is a limit to obtaining desired performance.

A general semiconductor package has a form in which a processor package in which a processor chip is disposed and a memory package in which a memory chip is attached are connected as one. A semiconductor package is provided a processor chip and a memory chip as one integrated package, and thus has advantages of reducing a mounting region of the chip and enabling high-speed signals through a short path.

The semiconductor package as described above has the advantages, it is widely applied to mobile devices and the like.

On the other hand, a size of a package has recently increased due to high specification of an electronic device such as a mobile device and adoption of HBM (High Bandwidth Memory), and accordingly, a semiconductor package including an interposer is mainly used. In this case, the interposer is provided with a silicon substrate.

However, when an interposer such as a silicon substrate is applied, there are problems in that a cost for manufacturing the interposer is high and formation of a Through Silicon Via (TSV) is complicated.

In addition, a conventional semiconductor package includes a connection member such as a silicon-based interconnect bridge. When a silicon-based interconnect bridge is applied, there is a reliability issue due to a mismatch in coefficient of thermal expansion (CTE) between a silicon material of the bridge and an organic material of the substrate, and there is a problem of deterioration of power integrity characteristics.

DISCLOSURE

Technical Problem

The embodiment provides a semiconductor package having a novel structure.

In addition, the embodiment provides a semiconductor package in which a plurality of processor chips are mounted side-by-side.

In addition, embodiment provides a semiconductor package in which a plurality of processor chips and a memory chip are mounted side-by-side.

Technical problems to be solved by the proposed embodiments are not limited to the above-mentioned technical problems, and other technical problems not mentioned can be clearly understood by those skilled in the art to which the embodiments proposed from the following descriptions belong.

Technical Solution

A semiconductor package according to an embodiment comprises a first substrate layer; and a second substrate layer disposed on the first substrate layer, wherein the first substrate layer includes: at least one first insulating layer; a first circuit pattern disposed on the first insulating layer; and a first via passing through the first insulating layer and connected to the first circuit pattern, wherein the second substrate layer includes: a second insulating layer disposed on the first insulating layer; a second circuit pattern disposed on the second insulating layer; and a second via passing through the second insulating layer and connected to the second circuit pattern, wherein a width of the first via is different from a width of the second via, and wherein at least one of a line width and a spacing of the first circuit pattern is different from at least one of a line width and a spacing of the second circuit pattern.

In addition, the first insulating layer includes prepreg, and the second insulating layer includes PID (Photo imageable dielectrics).

In addition, the width of the second via is smaller than the width of the first via.

In addition, at least one of the line width and spacing of the second circuit pattern is smaller than at least one of the line width and spacing of the first circuit pattern.

In addition, the first insulating layer includes: a first-first insulating layer; and a first-second insulating layer disposed at a lower surface of the first-first insulating layer, wherein the first circuit pattern includes: a first-first circuit pattern disposed at an upper surface of the first-first insulating layer; a first-second circuit pattern disposed between the first-first insulating layer and the first-second insulating layer; and a first-third circuit pattern disposed at a lower surface of the first-second insulating layer, wherein the first via includes: a first-first via passing through the first-first insulating layer; and a first-second via passing through the first-second insulating layer, wherein the first-first circuit pattern has an ETS (Embedded Trace Substrate) structure embedded at the upper surface of the first-first insulating layer.

In addition, the second insulating layer includes: a second-first insulating layer disposed at an upper surface of the first-first insulating layer; and a second-second insulating layer disposed at an upper surface of the second-first insulating layer, wherein the second circuit pattern includes: a second-first circuit pattern disposed at an upper surface of the second-first insulating layer; and a second-second circuit pattern disposed at an upper surface of the second-second insulating layer, wherein the second via includes: a second-first via passing through the second-first insulating layer; and a second-second via passing through the second-second insulating layer.

In addition, the second-first insulating layer is in direct contact with the upper surface of the first-first insulating layer and disposed to cover the upper surface of the first-first insulating layer and an upper surface of the first-first circuit pattern.

In addition, widths of the second-first via and the second-second via are smaller than widths of the first-first via and the first-second via, and wherein the width of the second-first via is different from the width of the second-second via.

In addition, the first-first via and the first-second via have a width of a lower surface greater than a width of an upper surface, and wherein a width of each of the lower surfaces of the first-first via and the first-second via satisfies a range of 15 μm to 40 μm.

In addition, the second-second circuit pattern is a circuit pattern disposed on an outermost side of the second substrate layer, wherein the second-second via is in direct connect with the second-second circuit pattern, wherein the second-second via has a width of an upper surface greater than a width of a lower surface, and wherein the width of the upper surface of the second-second via satisfies a range of 1 μm to 6 μm.

In addition, a width of an upper surface of the second-first via is greater than a width of a lower surface of the second-first via, and the width of the upper surface of the second-first via is greater than a width of an upper surface of the second-second via, and smaller than a width of a lower surface of the first-first via.

In addition, the second-second circuit pattern includes: a first pad disposed in a first chip mounting region; a second pad disposed in a second chip mounting region; and a plurality of traces connecting between the first pad and the second pad, wherein a line width of the trace satisfies a range of 1 μm to 6 μm, and a spacing between the plurality of traces satisfies a range of 1 μm to 6 μm.

In addition, a width of a pad of the second-first circuit pattern is greater than a width of each of the first and second pads of the second-second circuit pattern and smaller than a width of a pad of the first-first circuit pattern.

In addition, the second-second circuit pattern is disposed in a pattern recess formed at an upper surface of the second-second insulating layer.

In addition, a layer structure of the first-first circuit pattern is different from a layer structure of each of the first-second circuit pattern and the first-third circuit pattern.

In addition, each of the second-first circuit pattern and the second-second circuit pattern includes: a first plating layer including titanium; a second metal layer disposed on the first plating layer and including copper; and a third metal layer disposed on the second metal layer and including copper.

Meanwhile, a semiconductor package according to an embodiment includes a first substrate layer including at least one first insulating layer, a first circuit pattern disposed on the first insulating layer, and a first via passing through the first insulating layer; a second substrate layer including a second-first insulating layer disposed on an upper surface of the first insulating layer, a second-second insulating layer disposed on an upper surface of the second-first insulating layer and being an outermost insulating layer, a second-first circuit pattern disposed on an upper surface of the second-first insulating layer, a second-second circuit pattern disposed on an upper surface of the second-second insulating layer, a second-first via passing through the second-first insulating layer, and a second-second via passing through the second-second insulating layer; first and second adhesive parts arranged to be spaced apart from each other on the second-second circuit pattern; a first chip and a second chip disposed on the first and second adhesive parts, respectively; a molding layer disposed on the second-second insulating layer and molding the first chip and the second chip; and a third adhesive part disposed on a lower surface of the circuit pattern disposed at a lowermost side among the first circuit pattern, wherein the first insulating layer includes prepreg, wherein the second-first insulating layer and the second-second insulating layer include PID (Photo imageable dielectrics), wherein the second-second circuit pattern includes a first pad on which the first adhesive portion is disposed, a second pad on which the second adhesive portion is disposed, and a trace connecting the first pad and the second pad, and wherein the trace satisfies a range of 1 μm to 6 μm.

In addition, the first chip corresponds to a central processor (CPU), and the second chip corresponds to a graphics processor (GPU).

In addition, the second-second circuit pattern includes a third pad spaced apart from the first pad or the second pad, and a memory chip is mounted on the third pad and connected to the first chip or the second chip.

In addition, a separation distance between the first chip and the second chip satisfies the range of 60 μm to 150 μm.

Advantageous Effects

In the semiconductor package of the embodiment, a chip is mounted on a circuit board. At this time, the circuit board includes a first substrate layer and a second substrate layer. The second substrate layer can include a PID and, accordingly, can include a fine pattern with a line width and a spacing corresponding to a plurality of different processor chips mounted on the circuit board. Accordingly, the embodiment can allow a plurality of different processor chips to be mounted on one circuit board, and further can allow easy connection between the plurality of processor chips within a limited space. Accordingly, the embodiment can be possible to improve the performance of an application processor by separating the plurality of processor chips according to function. Furthermore, the embodiment can easily connect the plurality of processor chips within a limited space, thereby reducing an overall volume of the semiconductor package and thereby slimming the electronic device.

In addition, the embodiment can minimize a separation distance between the first processor chip and the second processor chip disposed on the circuit board due to the characteristics of the second substrate layer. Accordingly, the embodiment can minimize the loss of signals transmitted between the first processor chip and the second processor chip, thereby improving product reliability.

In addition, in an embodiment, sizes of a first circuit pattern and a first via of a first substrate layer can be greater than sizes of a second circuit pattern and a second via of a second substrate layer. Specifically, a first insulating layer constituting the first substrate layer includes a prepreg, and a second insulating layer constituting the second substrate layer includes a PID. Accordingly, the sizes of the second circuit pattern and the second via included in the second substrate layer can be smaller than the sizes of the first circuit pattern and the first via included in the first substrate layer. At this time, in the embodiment, the width of the second vias included in the second substrate layer increases as it approaches the first substrate layer, and decreases as it moves away from the first substrate layer. Accordingly, the embodiment can minimize the transmission loss of the signal transmitted from the second substrate layer to the first substrate layer, and thereby improve communication performance.

In addition, the embodiment can mount a plurality of processor chips side by side on one substrate, and thus the thickness of the semiconductor package can be significantly reduced compared to the comparative example.

In addition, the embodiment can provide a semiconductor package with improved reliability by mounting both a plurality of processor chips and a memory chip on one substrate.

In addition, since the connection of a plurality of circuit boards is not required to connect a plurality of processor chips and memory chips, the embodiment can improve the convenience of the process and the reliability of the electrical connection.

DESCRIPTION OF DRAWINGS

FIG. 1 is a cross-sectional view showing a semiconductor package according to a comparative example.

FIG. 2 is a cross-sectional view showing a circuit board according to a first embodiment.

FIG. 3 is an enlarged view of a first substrate layer of FIG. 2.

FIG. 4 is a view showing in detail a layer structure of a first circuit pattern constituting a first substrate layer of FIG. 3.

FIG. 5 is an enlarged view of a second substrate layer of FIG. 2.

FIG. 6 is a view showing in detail a layer structure of a second circuit pattern constituting a second substrate layer of FIG. 5.

FIG. 7 is a plan view of a second-third circuit pattern of FIG. 5.

FIG. 8 is a plan view of a second-second circuit pattern of FIG. 5.

FIG. 9 is a plan view of a second-first circuit pattern of FIG. 5.

FIGS. 10 to 29 are views for explaining a method of manufacturing the circuit board of FIG. 2 in order of processes.

FIG. 30 is a view showing a semiconductor package according to a first embodiment.

FIG. 31 is a view showing a circuit board according to a second embodiment.

FIG. 32 is a view showing a second substrate layer of FIG. 31.

FIG. 33 is a plan view of an outermost side of a second substrate layer of FIG. 32.

FIG. 34 is a view showing a semiconductor package according to a second embodiment.

BEST MODE

Hereinafter, embodiments of the present disclosure will be described in detail with reference to the accompanying drawings.

However, the spirit and scope of the present disclosure is not limited to a part of the embodiments described, and can be implemented in various other forms, and within the spirit and scope of the present disclosure, one or more of the elements of the embodiments can be selectively combined and replaced.

In addition, unless expressly otherwise defined and described, the terms used in the embodiments of the present disclosure (including technical and scientific terms) can be construed the same meaning as commonly understood by one of ordinary skill in the art to which the present disclosure belongs, and the terms such as those defined in commonly used dictionaries can be interpreted as having a meaning that is consistent with their meaning in the context of the relevant art. In addition, the terms used in the embodiments of the present disclosure are for describing the embodiments and are not intended to limit the present disclosure.

In this specification, the singular forms can also include the plural forms unless specifically stated in the phrase, and can include at least one of all combinations that can be combined in A, B, and C when described in "at least one (or more) of A (and), B, and C". Further, in describing the elements of the embodiments of the present disclosure, the terms such as first, second, A, B, (a), and (b) can be used.

These terms are only used to distinguish the elements from other elements, and the terms are not limited to the essence, order, or order of the elements. In addition, when an element is described as being "connected", "coupled", or "contacted" to another element, it can include not only when the element is directly "connected" to, "coupled" to, or "contacted" to other elements, but also when the element is "connected", "coupled", or "contacted" by another element between the element and other elements.

In addition, when described as being formed or disposed "on (over)" or "under (below)" of each element, the "on (over)" or "under (below)" can include not only when two elements are directly connected to each other, but also when one or more other elements are formed or disposed between two elements. Further, when expressed as "on (over)" or "under (below)", it can include not only the upper direction but also the lower direction based on one element.

COMPARATIVE EXAMPLE

FIG. 1 is a cross-sectional view showing a semiconductor package according to a comparative example.

Referring to FIG. 1, in a comparative example, at least two packages are required to transmit signals to a main board of an electronic device.

The semiconductor package included in the electronic device in the comparative example can be a combination of at least two or more packages.

The semiconductor package according to the comparative example includes a first package 10 and a second package 20.

The first package 10 is a processor package on which a processor chip 12 is mounted. And, the second package 20 is a memory package in which a memory chip 23 is mounted.

The first package 10 includes a first substrate 11 on which the processor chip 12 is mounted. The first substrate 11 has a multi-layer structure and includes one side on which the processor chip 12 is disposed and the other side on which a first adhesive ball 16 is disposed. The first package 10 has a fan-out structure and is attached to the main board (not shown) of the electronic device using the first adhesive ball 16 disposed on the other side.

The processor chip 12 is mounted on the first substrate 11. The processor chip 12 is an integrated processor chip that integrates various functions. Accordingly, a size of the processor chip 12 increases in proportion to the number of functions it provides. The first substrate 11 allows the processor chip 12 to be mounted and has a function of connecting the processor chip 12 and the main mode of the electronic device.

Meanwhile, the first package 10 of the comparative example further includes a second substrate 15. The second substrate 15 is an interposer that interconnects the first package 10 and the second package 20.

That is, the semiconductor package in the comparative example essentially includes an interposer such as the second substrate 15. In addition, the semiconductor package in the comparative example has a problem in that an overall volume increases in proportion to a thickness of the interposer. Accordingly, a thickness of the electronic device in the semiconductor package of the comparative example increases, and there is a limit to slimming.

In addition, the semiconductor package in the comparative example has a problem in that a length of the signal transmission line increases as the first package 10 and the second package 20 are interconnected using the second substrate 15. That is, in the semiconductor package in the comparative example, in order to transmit the signals of the processor chip 12 and the signals of the memory chip 23, they must pass through at least the second substrate 15, and accordingly, the signal transmission distance between the processor chip 12 and the memory chip 23 increases corresponding to the length of the signal transmission line of the second substrate 15. Accordingly, in the comparative example, there is a problem that high-speed communication between the processor chip 12 and the memory chip 23 is difficult due to the second substrate 15. Furthermore, the comparative example has a structure vulnerable to noise as the signal transmission distance by the second substrate 15 increases, and thus communication performance decreases.

Meanwhile, the first package 10 of the comparative example includes a second adhesive ball 13 disposed on the first substrate 11, and a first molding layer 14 that molds the second adhesive ball 13 and the processor chip 12. At this time, the first molding layer 14 protects the processor chip 12 and the second adhesive ball 13. Accordingly, a thickness of the first molding layer 14 is determined by a height of the processor chip 12 and the second adhesive ball 13. However, the comparative example further includes the second substrate 15 disposed over the first molding layer 14, and accordingly, the thickness of the first molding layer 14 increases because the influence of the second substrate 15 must also be considered.

In addition, the second package 20 of the comparative example includes a third substrate 22, a memory chip 23 disposed on the third substrate 22, and a second molding layer 24.

As described above, in the comparative example, at least three substrates are required to electrically connect the processor chip 12 and the memory chip 23 to each other. In addition, in the comparative example, a process for bonding at least three substrates to each other is required, and accordingly, there is a problem of decreased yield due to an increase in the number and complexity of manufacturing processes. Specifically, the comparative example requires at least three substrates due to the difficulty of the process of placing different chips on one substrate.

In addition, in the comparative example, at least two adhesive balls are required to bond at least three substrates to each other.

That is, the comparison example includes a second adhesive ball 13 for connecting the first substrate 11 and the second substrate 15, and a third adhesive ball 21 for connecting the second substrate 15 and the third substrate 22. Accordingly, the semiconductor package according to the comparative example requires at least two adhesive balls to bond a plurality of substrates to each other, and has a problem in that the reliability of the semiconductor package can be deteriorated due to poor connection of the adhesive balls. In addition, it has a structure in which two or more adhesive balls are arranged in the thickness direction, and there is a problem that the thickness of the semiconductor package, and further the thickness of the electronic device increase by the thickness of the adhesive balls.

Specifically, the first substrate 11 has a first thickness t1 of 120 µm to 150 µm. A second thickness t2 including the first molding layer 14, the processor chip 12, and the second adhesive ball 13 is 145 µm to 160 µm. In addition, a third thickness t3 of the second substrate 15 is 90 µm to 110 µm. In addition, a fourth thickness t4 of the first adhesive ball 16 is 130 µm to 150 µm.

Accordingly, a total thickness t8 of the first package 10 including the first to fourth thicknesses t1, t2, t3, and t4 is 480 µm to 550 µm.

In addition, a fifth thickness t5 of the third adhesive ball 21 is 145 µm to 180 µm. In addition, a sixth thickness t6 of the third substrate 22 is 90 µm to 110 µm. In addition, a seventh thickness t7 including the memory chip 23 and the second molding layer 24 is 370 µm to 400 µm. Accordingly, a total thickness t9 of the second package 20 including the fifth to seventh thicknesses t5, t6, and t7 is 610 µm to 700 µm. Accordingly, a total thickness of the semiconductor package in the comparative example is 1100 µm or more.

Meanwhile, due to the recent slimming of electronic devices, the thickness of the semiconductor package is required to be 1100 µm or less. In addition, recently, a type of electronic device is mainly foldable products, and the foldable product has a characteristic that the restrictions in the length direction are small, but the restrictions in the thickness direction are great. However, since the semiconductor package of the comparative example has a structure in which a plurality of substrates are bonded to each other through a plurality of adhesive balls in the thickness direction, there is a problem in that it does not satisfy the specifications required by electronic devices.

In addition, as the performance of electrical/electronic products has recently improved, technologies for attaching a larger number of packages to a limited-sized substrate are being researched, and thus, there is a demand for finer circuit patterns. However, in a case of the semiconductor package of the comparative example, there is a limit to miniaturization of the circuit pattern. The circuit pattern included in the semiconductor package of the comparative example has a line width of at least 10 µm and a spacing of at least 10 µm. In addition, as the number of functions processed in an application processor (AP) has recently increased, it has become difficult to implement them on a single chip. However, in the case of the circuit pattern provided in the comparative example, it is difficult to mount two application processors (APs) performing different functions on the one first substrate 11.

The embodiment is intended to solve the problems of the comparative example, and provides a circuit board with a novel structure on which a plurality of application processor chips can be mounted on one board and a semiconductor package including the same.

Furthermore, the embodiment is intended to solve the problems of the comparative example, and provides a circuit board with a novel structure capable of mounting an application processor chip and a memory chip side by side, and a semiconductor package including the same.

—Electronic Device—

Before describing an embodiment, an electronic device to which a semiconductor package of the embodiment is applied will be briefly described. An electronic device includes a main board (not shown). The main board can be physically and/or electrically connected to various components. For example, the main board can be connected to the semiconductor package of the embodiment. Various semiconductor devices can be mounted on the semiconductor package. Broadly, the various semiconductor devices mounted on the semiconductor package can include a memory chip such as a volatile memory (e.g., DRAM), a non-volatile memory (e.g., ROM), and a flash memory, an application processor chip such as a central processor (e.g., CPU), a graphics processor (e.g., GPU), a digital signal processor, a cryptographic processor, a microprocessor, and a microcontroller, and a logic chip such as an analog-to-digital converter and an application-specific IC (ASIC).

In addition, the embodiment provides a semiconductor package that can mount at least two different types of chips on one substrate while reducing the thickness of the semiconductor package connected to the main board of the electronic device.

In this case, the electronic device can include a smart phone, a personal digital assistant, a digital video camera, a digital still camera, a network system, a computer, a monitor, a tablet, a laptop, a netbook, a television, a video game, a smart watch, an automotive, and the like. However, the embodiment is not limited thereto, and can be any other electronic device that processes data in addition to these.

Embodiment

Hereinafter, a circuit board and a semiconductor package including the circuit board according to an embodiment will be described in detail. That is, the embodiment described below refer to a circuit board that provides a space on which a chip can be mounted. And the semiconductor package can refer to a package with a chip mounted on the circuit board.

FIG. 2 is a cross-sectional view showing a circuit board according to a first embodiment, FIG. 3 is an enlarged view of a first substrate layer of FIG. 2, FIG. 4 is a view showing in detail a layer structure of a first circuit pattern constituting a first substrate layer of FIG. 3, FIG. 5 is an enlarged view of a second substrate layer of FIG. 2, and FIG. 6 is a view showing in detail a layer structure of a second circuit pattern constituting a second substrate layer of FIG. 5.

Hereinafter, schematic features of a circuit board 300 according to an embodiment will be described with reference to FIGS. 2 to 6.

Referring to FIGS. 2 to 6, the circuit board 300 includes a plurality of substrate layers. Here, the plurality of substrate layers is not a plurality of board structures manufactured separately from each other and then bonded to each other through a bonding layer, and refers to a single board manufactured through the general additive manufacturing process of a circuit board.

The circuit board 300 in the first embodiment allows at least two different chips to be mounted. For example, the circuit board 300 in the first embodiment can include a plurality of chip mounting regions in which at least two processor chips can be mounted. Unlike this, the circuit board 300 in the first embodiment can include a plurality of chip mounting regions in which one processor chip and one memory chip can be mounted. Hereinafter, the circuit board 300 of the first embodiment will be described as including a plurality of chip mounting regions in which two different processor chips can be mounted. However, the embodiment is not limited to this, and one processor chip and one memory chip can be mounted on the circuit board 300.

The circuit board 300 includes a first substrate layer 100 and a second substrate layer 200.

The first substrate layer 100 can have a multiple layer structure. For example, the first substrate layer 100 can have at least a two-layer structure. For example, the first substrate layer 100 can include at least two insulating layers. The first substrate layer 100 can be a portion of a circuit board connected to a main board of an electronic device.

The second substrate layer 200 is disposed on a first surface of the first substrate layer 100. For example, the first substrate layer 100 includes a first surface and a second surface opposite to the first surface. In addition, the second surface of the first substrate layer 100 can be a portion where an adhesive ball (described later) for bonding to an electronic device is disposed. In addition, the first surface of the first substrate layer 100 can be opposite to the surface on which the adhesive ball is disposed.

The second substrate layer 200 can have a multiple layer structure. For example, the second substrate layer 200 can have a structure of at least two layers. For example, the second substrate layer 200 can include at least two insulating layers. The second substrate layer 200 can be a portion of a circuit board where a plurality of chips are mounted. For example, the second substrate layer 200 includes a first surface and a second surface. In addition, the first surface of the second substrate layer 200 can be a portion where two different chips are mounted. And, the second surface of the second substrate layer 200 can be a surface facing the first surface of the first substrate layer 100. That is, the second surface of the second substrate layer 200 can be a surface in direct contact with the first surface of the first substrate layer 100. For example, the first surface of each of the first substrate layer 100 and the second substrate layer 200 can refer to an upper surface, and the second surface of each of the first substrate layer 100 and the second substrate layer 200 can refer to a lower surface, but are not limited thereto. For example, the first surface can refer to a lower surface, and the second surface can refer to an upper surface.

The first substrate layer 100 can include a plurality of first insulating layers 110.

For example, the first substrate layer 100 can include a first-first insulating layer 111, a first-second insulating layer 112, and a first-third insulating layer 113. At this time, in the drawing, the first substrate layer 100 is shown as having a three-layer structure based on the number of insulating layers, but the embodiment is not limited thereto. For example, the first substrate layer 100 can include two insulating layers, or alternatively, can include four or more insulating layers.

The first-first insulating layer 111, first-second insulating layer 112, and first-third insulating layer 113 can include a same insulating material. For example, the first-first insulating layer 111, the first-second insulating layer 112, and the first-third insulating layer 113 can include a first insulating material. For example, the first-first insulating layer 111, the first-second insulating layer 112, and the first-third insulating layer 113 can be composed of a prepreg. The prepreg can be formed by impregnating an epoxy resin or the like into a fiber layer in the form of a fabric sheet, such as a glass fabric woven with glass fiber yarn, and then performing heat compression. However, the embodiment is not limited thereto, and the prepreg constituting the first-first insulating layer 111, first-second insulating layer 112, and first-third insulating layer 113 can include a fiber layer in the form of a fabric sheet woven with carbon fiber yarn.

For example, the first-first insulating layer 111, first-second insulating layer 112, and first-third insulating layer 113 can include a resin and a reinforcing fiber disposed in the resin. The resin can be an epoxy resin, but is not limited thereto. The resin is not particularly limited to the epoxy resin, and for example, one or more epoxy groups can be included in the molecule, or alternatively, two or more epoxy groups can be included, or alternatively, four or more epoxy groups can be included. In addition, the resin 110 can include a naphthalene group, for example, can be an aromatic amine type, but is not limited thereto. For example, the resin can be include a bisphenol A type epoxy resin, a bisphenol F type epoxy resin, a bisphenol S type epoxy resin, a phenol novolac type epoxy resin, an alkylphenol novolac type epoxy resin, a biphenyl type epoxy resin, an aralkyl type epoxy resin, dicyclopentadiene type epoxy resin, naphthalene type epoxy resin, naphthol type epoxy resin, epoxy resin of condensate of phenol and aromatic aldehyde having phenolic hydroxyl group, biphenyl aralkyl type epoxy resin, fluorene type epoxy resin resins, xanthene-type epoxy resins, triglycidyl isocyanurate, rubber-modified epoxy resins, phosphorous-based epoxy resins, and the like, and naphthalene-based epoxy resins, bisphenol A-type epoxy resins, and phenol novolac epoxy resins, cresol novolak epoxy resins, rubber-modified epoxy resins, and phosphorous-based epoxy resins. In addition, the reinforcing fiber can include glass fiber, carbon fiber, aramid fiber (e.g., aramid-based organic material), nylon, silica-based inorganic material or titania-based inorganic material. The reinforcing fibers can be arranged in the resin to cross each other in a planar direction.

Meanwhile, the glass fiber, carbon fiber, aramid fiber (e.g., aramid-based organic material), nylon, silica-based inorganic material or titania-based inorganic material can be used.

Meanwhile, the first-first insulating layer 111 can be a first-first outermost insulating layer disposed on an first outermost side of the first substrate layer 100. In addition, the first-third insulating layer 113 can be a first-second outermost insulating layer disposed on a second outermost side, which is opposite to the first outermost side, of the first substrate layer 100. In addition, the first-second insulating layer 112 can be a first inner insulating layer disposed inside the first substrate layer 100. Also, when the first substrate layer 100 has a layer structure of four or more layers, the first inner insulating layer can be composed of a plurality of layers.

The first-first insulating layer 111, first-second insulating layer 112, and first-third insulating layer 113 can each have a thickness ranging from 10 μm to 30 μm. For example, each thickness of the first-first insulating layer 111, first-second insulating layer 112, and first-third insulating layer 113 can satisfy a range of 15 μm to 25 μm. For example, each thickness of the first-first insulating layer 111, first-second insulating layer 112, and first-third insulating layer 113 can satisfy a range of 18 μm to 23 μm. The thickness of each of the insulating layer can correspond to a distance between circuit patterns. For example, the thickness of the first-first insulating layer 111 can mean a distance between a lower surface of the first-first circuit pattern 121 and an upper surface of the first-second circuit pattern 122. For example, a thickness of the first-second insulating layer 112 can mean a distance from a lower surface of the first-second circuit pattern 122 to an upper surface of the first-third circuit pattern 123. For example, a thickness of the first-third insulating layer 113 can mean a distance from a lower surface of the first-third circuit pattern 123 to an upper surface of the first-fourth circuit pattern 124.

The first substrate layer 100 can include a first circuit pattern 120 disposed on a surface of each insulating layer.

At this time, the circuit pattern of the first substrate layer 100 can have an Embedded Trace Substrate (ETS) structure. For example, among the circuit patterns of the first substrate layer 100, a circuit pattern disposed on the first outermost side can have a structure embedded in the insulating layer, a circuit pattern disposed on the second outermost side opposite to the first outermost side can have a structure that protrudes above the surface of the insulating layer.

For example, the first substrate layer 100 includes a first-first circuit pattern 121 disposed on a first surface of the first-first insulating layer 111. The first-first circuit pattern 121 can have an ETS structure. For example, the first-first circuit pattern 121 can have a structure embedded in the first-first insulating layer 111. For example, the first surface of the first-first circuit pattern 121 can be positioned on the same plane as the first surface of the first-first insulating layer 111. For example, the upper surface of the first-first circuit pattern 121 can be positioned on the same plane as the upper surface of the first-first insulating layer 111. In addition, the side and lower surfaces of the first-first circuit pattern 121 can be covered by the first-first insulating layer 111.

That is, the first-first circuit pattern 121 is a circuit pattern disposed closest to the second substrate layer 200 in the vertical direction among the first circuit patterns 120 disposed on the first substrate layer 100. In addition, the first-first circuit pattern 121 has an ETS structure. That is, the first-first circuit pattern 121 is a pattern manufactured by the ETS method, and thus can be embedded in the first surface of the first-first insulating layer 111. This ETS structure has a structure in which the circuit pattern is embedded in the insulating layer, and accordingly, it is possible to refine the circuit pattern compared to the comparative example of manufacturing a circuit pattern with a protruding structure on the insulating layer. Accordingly, in the embodiment, a difference in line width or spacing between the second circuit pattern 220 and the first circuit pattern 120 disposed on the second substrate layer 200 can be minimized. That is, the second circuit pattern 220 of the second substrate layer 200 is a fine pattern corresponding to specifications of the terminals of the processor chip, as will be described below. At this time, when the first-first circuit pattern 121 disposed closest to the second circuit pattern 220 has a general protruding structure, signal transmission loss can increase due to the numerical difference in line widths between the second circuit pattern 220 and the first-first circuit pattern 121. Accordingly, in the embodiment, the first-first circuit pattern 121 has an ETS structure, and accordingly, the numerical difference (e.g., line width and spacing) between the first-first circuit pattern 121 and the second circuit pattern 220 is minimized. As a result, in the embodiment, signal transmission loss that can occur due to a numerical difference between the second circuit pattern and the first-first circuit pattern 121 can be minimized. Furthermore, in the embodiment, the numerical difference between the first and second circuit patterns is further minimized through changes in the numerical values of the second circuit pattern 220 for each layer, which will be described below.

The first substrate layer 100 includes a first-second circuit pattern 122 disposed on the second surface of the first-first insulating layer 111. The first-second circuit pattern 122 can protrude downward from the second or lower surface of the first-first insulating layer 111. In addition, the side and lower surfaces of the first-second circuit pattern 122 can be covered by the first-second insulating layer 112.

The first substrate layer 100 includes a first-third circuit pattern 123 disposed on the second or lower surface of the first-second insulating layer 112. The first-third circuit pattern 123 can protrude downward from the second or lower surface of the first-second insulating layer 112. In addition, the side and lower surfaces of the first-third circuit pattern 123 can be covered by the first-third insulating layer 113.

The first substrate layer 100 includes a first-fourth circuit pattern 124 disposed on the second or lower surface of the first-third insulating layer 113. The first-fourth circuit pattern 124 can protrude downward from the second or lower surface of the first-third insulating layer 113.

The first circuit pattern 120 including the first-first circuit pattern 121, first-second circuit pattern 122, first-third circuit pattern 123, and first-fourth circuit pattern 124 can be formed of at least one metal material selected from gold (Au), silver (Ag), platinum (Pt), titanium (Ti), tin (Sn), copper (Cu), and zinc (Zn). In addition, the first circuit pattern 120 can be formed of a paste or solder paste containing at least one metal material selected from gold (Au), silver (Ag), platinum (Pt), titanium (Ti), tin (Sn), copper (Cu), and zinc (Zn) with excellent bonding strength. Preferably, the first circuit pattern 120 can be formed of copper (Cu), which has high electrical conductivity and is relatively inexpensive.

Each of the first-first circuit pattern 121, first-second circuit pattern 122, first-third circuit pattern 123, and first-fourth circuit pattern 124 can have a thickness in a range of 7 $\mu$m to 20 $\mu$m. For example, each of the first-first circuit pattern 121, first-second circuit pattern 122, first-third circuit pattern 123, and first-fourth circuit pattern 124 can have a thickness in a range of 9 $\mu$m to 17 $\mu$m. Each of the first-first circuit pattern 121, first-second circuit pattern 122, first-third circuit pattern 123, and first-fourth circuit pattern 124 can have a thickness in a range of 10 $\mu$m to 13 $\mu$m. When the thickness of each of the first circuit patterns 120 is less than 7 $\mu$m, the resistance of the first circuit pattern 120 can increase. When the thickness of each of the first circuit patterns 120 exceeds 17 $\mu$m, it can be difficult to implement the fine pattern required for the first substrate layer.

The first circuit pattern 120 including the first-first circuit pattern 121, first-second circuit pattern 122, first-third circuit pattern 123, and first-fourth circuit pattern 124 includes a pad and a trace. The pad can include a via pad connected to a via, a core pad or a BGA pad on which an adhesive ball (described later) connected to the main board of the electronic device is disposed. In addition, the trace can refer to a long line-shaped wiring that is connected to the pad and transmits an electrical signal. The pad (specifically, via pad) of the first circuit pattern 120 can have a width in a range of 20 $\mu$m to 50 $\mu$m. The pad of the first circuit pattern 120 can have a width in a range of 22 $\mu$m to 40 $\mu$m. The pad of the first circuit pattern 120 can have a width in a range of 25 $\mu$m to 35 $\mu$m. For example, the first substrate layer 100 includes first via disposed in each insulating layer. At this time, the first insulating layer 110 is formed of the prepreg containing reinforcing fibers. Accordingly, the first via in the first insulating layer 110 have a size of at least 15 $\mu$m. Accordingly, the pad of the first circuit pattern 120 can have a width greater than the width of the first via in order to be connected to the first via.

Meanwhile, the trace of the first circuit pattern 120 can have a specific line width and a specific spacing. For example, the line width of the trace of the first circuit pattern 120 can have a range of 6 $\mu$m to 20 $\mu$m. For example, the line width of the trace of the first circuit pattern 120 can have a range of 7 $\mu$m to 15 $\mu$m. For example, the line width of the trace of the first circuit pattern 120 can have a range of 8 $\mu$m to 12 $\mu$m. In addition, the spacing between traces of the first circuit pattern 120 can have a range of 6 $\mu$m to 20 $\mu$m. For example, the spacing between traces of the first circuit pattern 120 have a range of 7 $\mu$m to 15 $\mu$m. For example, the spacing between traces of the first circuit pattern 120 can have a range of 8 $\mu$m to 12 $\mu$m.

In addition, the first substrate layer 100 includes a first via 130 disposed in the first insulating layer 110. The first via 130 can be formed to pass through one first insulating layer, or alternatively, can be formed to commonly pass through at least two first insulating layers.

The first via 130 includes a first-first via 131 that passes through the first-first insulating layer 111. The first-first via 131 can have a first surface connected to a lower surface of the first-first circuit pattern 121 and a second surface connected to an upper surface of the first-second circuit pattern 122.

The first via 130 includes a first-second via 132 that passes through the first-second insulating layer 112. The first-second via 132 can have a first surface connected to a lower surface of the first-second circuit pattern 122 and a second surface connected to an upper surface of the first-third circuit pattern 123.

The first via 130 includes a first-third via 133 that passes through the first-third insulating layer 113. The first-third via 133 can have a first surface connected to a lower surface of the first-third circuit pattern 123 and a second surface connected to an upper surface of the first-fourth circuit pattern 124.

The first-first via 131, the first-second via 132, and the first-third via 133 can have a same shape. For example, the first-first via 131, the first-second via 132, and the first-third via 133 can have a trapezoidal shape where the width of the first side and the width of the second side are different from each other. Preferably, a width of the upper surface of each of the first-first via 131, the first-second via 132, and the first-third via 133 can be smaller than a width of the lower surface of each of the first-first via 131, the first-second via 132, and the first-third via 133

The width of each of the first-first via 131, the first-second via 132, and the first-third via 133 can have a range of 15 $\mu$m to 40 $\mu$m. The width of each of the first-first via 131, the first-second via 132, and the first-third via 133 can have a range of 18 $\mu$m to 35 $\mu$m. The width of each of the first-first via 131, the first-second via 132, and the first-third via 133 can have a range of 20 $\mu$m to 30 $\mu$m.

The first-first via 131, the first-second via 132, and the first-third via 133 pass through the first insulating layer 110 made of the prepreg as described above. The first-first via 131, the first-second via 132, and the first-third via 133 can be formed by filling a conductive material inside a via hole passing through the first insulating layer 110. At this time, reinforcing fibers are provided in the first insulating layer 110. Accordingly, the via hole formed in the first insulating layer 110, and the first-first via 131, the first-second via 132, and the first-third via 133 filling the inside of the via hole can have a width of at least 15 $\mu$m. At this time, the width of each of the first-first via 131, the first-second via 132, and the first-third via 133 described above can refer to the width of a surface with a great width among the first and second surfaces of each of the first-first via 131, the first-second via 132, and the first-third via 133. For example, the width of each of the first-first via 131, the first-second via 132, and the first-third via 133 described above can refer to a width of the second or lower surface of each of the first-first via 131, the first-second via 132, and the first-third via 133.

Meanwhile, the first-first via 131, the first-second via 132, and the first-third via 133 can be formed by filling a via hole (not shown) passing through each insulating layer 110 with a conductive material.

The via hole can be formed by any one of mechanical, laser, and chemical processing. When the via hole is formed by machining, it can be formed using methods such as milling, drilling, and routing. When the via hole is formed by laser processing, it can be formed using methods such as UV or CO2 laser. When the via hole is formed by chemical processing, it can be formed using a chemical containing amino silane, ketones, or the like. Accordingly, the embodiment can open at least one insulating layer among the plurality of insulating layers.

Meanwhile, the laser processing is a cutting method that concentrates optical energy on a surface to melt and evaporate a part of the material to take a desired shape, accordingly, complex formations by computer programs can be easily processed, and even composite materials that are difficult to cut by other methods can be processed.

In addition, the laser processing has a cutting diameter of at least 0.005 mm, and has the advantage of a wide range of processable thicknesses.

A laser processing drill preferably uses a YAG (Yttrium Aluminum Garnet) laser, a CO2 laser, or an ultraviolet (UV) laser. YAG laser is a laser that can process both copper foil layers and insulating layers, and CO2 laser is a laser that can process only insulating layers.

When the via hole is formed, each via can be formed by filling the inside of the via hole with a conductive material. The metal material forming the via can be any one material selected from copper (Cu), silver (Ag), tin (Sn), gold (Au), nickel (Ni), and palladium (Pd). In addition, the conductive material filling can use any one or a combination of electroless plating, electrolytic plating, screen printing, sputtering, evaporation, ink-jetting and dispensing.

Meanwhile, the first circuit pattern 120 and the first via 130 can have a multiple layer structure. However, in an embodiment, one of the first circuit patterns 120 has an ETS structure, and accordingly, the circuit pattern of the ETS structure can have a layer structure different from other circuit patterns.

For example, the first-first circuit pattern 121 can have a layer structure different from that of the first-second circuit pattern 122 and the first-third circuit pattern 123. For example, the number of layers of the first-first circuit pattern 121 can be different from the number of layers of the first-second circuit pattern 122 and the first-third circuit pattern 123. For example, the number of layers of the first-first circuit pattern 121 can be smaller than the number of layers of the first-second circuit pattern 122 and the first-third circuit pattern 123.

As an example, the first-first circuit pattern 121 can include only an electrolytic plating layer. Alternatively, the first-second circuit pattern 122 can include a seed layer 122-1 and an electrolytic plating layer 122-2. In addition, the first-third circuit pattern 123 can include a seed layer 123-1 and an electrolytic plating layer 123-2. That is, the first-first circuit pattern 121 is the pattern formed first in a process of manufacturing the first substrate layer, and accordingly, the seed layer of the first-first circuit pattern 121 is removed in a final process.

Meanwhile, the first-first via 131 includes a seed layer 131-1 and an electrolytic plating layer 131-2, corresponding to the first-second circuit pattern 122. In addition, the first-second via 132 includes a seed layer 132-1 and an electrolytic plating layer 132-2, corresponding to the first-third circuit pattern 123.

The first substrate layer 100 includes a protective layer 140. The protective layer 140 can protect the insulating layer and the circuit pattern disposed on the outermost side of the first substrate layer 100. For example, the protective layer 140 can be disposed on the second surface of the first-third insulating layer 113. The protective layer 140 can include an opening (not shown) exposing at least a portion of the lower surface of the first-fourth circuit pattern 124 disposed on the second surface of the first-third insulating layer 113.

Accordingly, the lowermost side of the first substrate layer 100 can include a protective region (PP) covered by the protective layer 140 and an open region (OP) exposed through the opening of the protective layer 140. In addition, at least a portion of the lower surface of the first-fourth circuit pattern 124 can be exposed to the outside through the open region OP.

In addition, the uppermost side of the first substrate layer 100 can be a first adhesive region or a first laminating region AR1. That is, second insulating layers constituting the second substrate layer 200 can be laminated on the uppermost side of the first substrate layer 100.

As described above, the first substrate layer 100 constituting the circuit board 300 in the embodiment has a plurality of layer structure. In addition, the first substrate layer 100 includes a plurality of insulating layers made of the prepreg to provide rigidity to the circuit board 300. The first substrate layer 100 can transmit signals transmitted from the second substrate layer 200 to the main board of the electronic device. Accordingly, the first substrate layer 100 can have specifications corresponding to the specifications (e.g., number of pads, spacing between pads, etc.) of the main board of the electronic device.

Meanwhile, the second substrate layer 200 is disposed on the first substrate layer 100. Specifically, the second substrate layer 200 is laminated on the first surface of the first substrate layer 100. For example, the plurality of insulating layers constituting the second substrate layer 200 can be sequentially laminated on the first-first insulating layer 111 disposed on the uppermost side of the first insulating layer 110 constituting the first substrate layer 100.

In an embodiment, the second substrate layer 200 can be a re-distribution layer (RDL). The second substrate layer 200 provides a mounting region where at least two chips of different types are mounted. In addition, the second substrate layer 200 can transmit signals transmitted from the first substrate layer 100 to the at least two mounted chips, or transmit signals acquired or processed in the at least two chips to the first substrate layer 100.

Accordingly, the second substrate layer 200 has a wiring structure on which at least two chips of different types can be mounted, and further has a wiring structure for transmitting signals between the chip and the first substrate layer 100.

Accordingly, the second substrate layer 200 of the embodiment can have a different wiring structure for each layer. Here, the wiring structure can include a line width of a circuit pattern, a spacing between circuit patterns, a width of the via, etc.

A lowermost side of the second substrate layer 200 is a portion laminated on the uppermost side of the first substrate layer 100. For example, the second substrate layer 200 can include a second laminating region AR2 laminated on the first laminating region AR1 of the first substrate layer 100.

In addition, an uppermost side of the second substrate layer 200 can include a chip mounting region where a plurality of chips are mounted. For example, the uppermost side of the second substrate layer 200 can include a chip mounting region R1 where a chip is mounted, and a region (R2) other than the chip mounting region R1.

In addition, the chip mounting region R1 can include a first mounting region MR1 in which a first chip is mounted, a second mounting region MR2 in which a second chip of a different type from the first chip is mounted, and a connection region CR connecting the first mounting region MR1 and the second mounting region MR2.

At this time, in the embodiment, a chip mounting region where a plurality of first and second chips of different types can be mounted on one circuit board 300 is provided. At this time, the first and second chips can be first and second processor chips in which the application processor integrated into one chip in the comparative example is separated according to function.

For example, in the embodiment, the first mounting region MR1 can be a region where the first processor chip is mounted, and the second mounting region MR2 can be a region where a second processor chip of a different type from the first processor chip is mounted. For example, the first processor chip can be one of an application processor (AP) chip such as a central processor (e.g., CPU), graphics processor (e.g., GPU), digital signal processor, cryptographic processor, microprocessor, and microcontroller. The second processor chip can be a different type of processor chip from the first processor chip among an application processor (AP) chip such as a central processor (e.g., CPU), graphics processor (e.g., GPU), digital signal processor, cryptographic processor, microprocessor, and microcontroller. For example, the first processor chip can be a central processor chip, and the second processor chip can be a graphics processor chip. That is, the circuit board of the embodiment can be a circuit board for die splitting, in which the application processor is separated by function and a plurality of separated processor chips are mounted on one board.

At this time, in this embodiment, the second substrate layer 200 requires miniaturization of the circuit pattern. For example, the second substrate layer 200, unlike the first substrate layer 100, requires a fine pattern with a line width of 6 μm or less. For example, the second substrate layer 200, unlike the first substrate layer 100, requires a fine pattern with a fine line width of 5 μm or less. For example, the second substrate layer 200, unlike the first substrate layer 100, requires a fine pattern with a fine line width of 4 μm or less.

In addition, the second substrate layer 200, unlike the first substrate layer 100 requires a fine pattern with a spacing of 6 μm or less. Here, the spacing can mean the spacing between traces of a circuit pattern arranged on the same layer. For example, the second substrate layer 200, unlike the first substrate layer 100, requires a fine pattern with a spacing of 5 μm or less. For example, the second substrate layer 200, unlike the first substrate layer 100, requires a fine pattern with a spacing of 4 μm or less. More preferably, the circuit pattern formed in the chip mounting region R1 of the second substrate layer 200 in the embodiment requires a fine pattern with a line width of 1 μm to 6 μm, preferably 1.2 μm to 5 μm, more preferably 1.5 μm to 4 μm. In addition, in the embodiment, the spacing between the traces of the circuit pattern formed in the chip mounting region R1 of the second substrate layer 200 requires a fine pattern with a line width of 1 μm to 6 μm, preferably 1.2 μm to 5 μm, more preferably 1.5 μm to 4 μm.

Before explaining an embodiment of the present invention, the reason why a fine pattern with the above line width and spacing is required in the second substrate layer 200 will be explained.

Recently, as the functions required for application processors increase, there is a demand for separate processor chips for each function and a circuit board on which these processor chips can be mounted. At this time, even when the application processor is divided into two processor chips for each function, the number of terminals (Input/Output) provided on each processor chip is increasing. At this time, unlike the case where all functions are processed by one application processor chip as in the comparative example, when the processor chip is divided into at least two, each processor chip must be electrically connected to each other to exchange signals.

At this time, when a separation distance between each processor chip is great, a fine pattern as in the embodiment may not be required. However, when a separation distance between each processor chip is great, the communication speed for mutual signal exchange can decrease. In addition, when the separation distance between each processor chip increases, power consumption required for communication increases. In addition, when the separation distance between each processor chip is great, the length of the trace connecting each processor chip also increases, which causes vulnerability to noise and increases signal transmission loss.

That is, the separation distance between the processor chips must be 150 μm or less for reliability. For example, the separation distance between the processor chips must be less than 120 μm for reliability. For example, the separation distance between the processor chips should be less than 100 μm for reliability.

Accordingly, in order to connect all the wiring between the first processor chip and the second processor chip within the limited space as described above, the circuit pattern is required to be refined to a specific line width and a specific spacing or less.

In addition, Additionally, conventionally, there were X number of connection wires between the first processor chip and the second processor chip. And, if there are X number of connecting wires, a level of refinement of the circuit pattern within the limited space described above can be different from the embodiment.

On the other hand, due to recent 5G, Internet of Things (IOT), increased image quality, increased communication speed, etc., the number of terminals in the first processor chip and the second processor chip is gradually increasing. Accordingly, recently, the connection wires between the first processor chip and the second processor chip can be 2 times or more (2×), 3 times or more (3×), or 10 times or more (10×) that of the prior art.

Accordingly, in order to mount the first processor chip and the second processor chip on one circuit board while minimizing the separation distance between them and connect the first processor chip and the second processor chip to each other within a limited space, ultra-fineness of the circuit pattern included in the second substrate layer 200 is required.

Accordingly, the embodiment allows connection to the main board of the electronic device through the first substrate layer 100 while satisfying the ultra-fineness of the circuit pattern required above using the second substrate layer 200.

The second substrate layer 200 can have a multiple layer structure. The second substrate layer 200 can have at least two layers based on the number of insulating layers.

For example, the second substrate layer 200 can include a second insulating layer 210.

The second insulating layer 210 can include a second-first insulating layer 211, a second-second insulating layer 212, and a second-third insulating layer 213. However, it is shown in the drawing that the number of layers of the second insulating layer 210 constituting the second substrate layer 200 is three layers, but the embodiment is not limited thereto. For example, the number of layers of the second insulating layer 210 can be two layers, or alternatively, can be 4 or more layers. However, the embodiment allows the second insulating layer 210 to be composed of at least two layers, so that the wiring between the first and second processor chips mounted on the chip mounting region R1 and the first substrate layer 100 can be smoothly connected.

The second-first insulating layer 211 is disposed on the first surface of the first substrate layer 100. Specifically, the second-first insulating layer 211 is disposed on the first or upper surface of the first-first insulating layer 111 of the first substrate layer 100. The second or lower surface of the second-first insulating layer 211 can in direct contact with the first or upper surface of the first-first insulating layer 111. In addition, the second surface or lower surface of the second-first insulating layer 211 can in direct contact with the first surface or upper surface of the first-first circuit pattern 121 embedded in the first-first insulating layer 111. For example, the second-first insulating layer 211 can be arranged to cover the first-first circuit pattern 121 and the first-first insulating layer 111. This means that the first substrate layer 100 and the second substrate layer 200 are not bonded through separate adhesive balls, and means that the second-first insulating layer 211, which is the lowest layer of the second substrate layer 200, is laminated directly on the first-first insulating layer 111, which is the uppermost layer of the first substrate layer 100.

The second-second insulating layer 212 is disposed on the first or upper surface of the second-first insulating layer 211. In addition, the second-third insulating layer 213 is disposed on the first or upper surface of the second-second insulating layer 212.

The second-first insulating layer 211 in the second insulating layer 210 can be the first outermost insulating layer or the lowermost insulating layer of the second substrate layer 200, which is in direct contact with the first substrate layer 100. In addition, the second-third insulating layer 213 in the second insulating layer 210 can be the second outermost insulating layer or the uppermost insulating layer of the second substrate layer 200. In addition, the second-second insulating layer 212 in the second insulating layer 210 can be an inner insulating layer. However, in an embodiment, when the second substrate layer 200 has a two-layer structure, the second-second insulating layer 212, which is the inner insulating layer, can be omitted. In addition, in an embodiment, when the second substrate layer 200 has a structure of four or more layers, there can be a plurality of second-second insulating layers 212, which is an inner insulating layer.

In one embodiment, the second insulating layer 210 including the second-first insulating layer 211, the second-second insulating layer 212, and the second-third insulating layer 213 can include a second insulating material. For example, the second insulating layer 210 can include a second insulating material different from the first insulating material constituting the first insulating layer 110.

Preferably, the second insulating layer 210 cannot include reinforcing fibers to enable implementation of an ultra-fine pattern. Preferably, the second insulating layer 210 can include a photocurable resin or a photosensitive resin. For example, the second insulating layer 210 can include a photo imageable dielectrics (PID).

To this end, the second insulating layer 210 can include an epoxy resin, photo initiator, a silicon filler (Si filler), and a curing agent. For example, the second insulating layer 210 can be formed by laminating a photocurable resin film or applying a photocurable resin paste or liquid. At this time, in one example, the photocurable resin material can include one or more selected from photocurable polyhydroxystyrene (PHS), photocurable polybenzoxazole (PBO), photocurable polyimide (PI), photocurable benzocyclobutene (BCB), photocurable polysiloxane, photocurable epoxy, and novolac resin.

In an embodiment, the second insulating layer 210 constituting the second substrate layer 200 includes a photocurable resin such as PID, thereby enabling the formation of relatively fine circuit patterns and vias. For example, when the second insulating layer 210 includes a photo-curable resin such as PID, unlike the via hole in the first insulating layer 110, the via hole in the second insulating layer 210 can be formed through an exposure and development process. Accordingly, in the embodiment, the second insulating layer 210 is made of a photocurable resin, so that it is possible to miniaturize the second via 230 passing through the second insulating layer 210 and to easily adjust the size of the second via 230.

Meanwhile, each insulating layer constituting the second insulating layer 210 can have a thickness thinner than a thickness each insulating layer constituting the first insulating layer 110. For example, each of the second-first insulating layer 211, second-second insulating layer 212, and second-third insulating layer 213 can have a thickness ranging from 3 $\mu$m to 20 $\mu$m. For example, each of the second-first insulating layer 211, second-second insulating layer 212, and second-third insulating layer 213 can have a thickness ranging from 4 $\mu$m to 18 $\mu$m. For example, each of the second-first insulating layer 211, second-second insulating layer 212, and second-third insulating layer 213 can have a thickness ranging from 6 $\mu$m to 15 $\mu$m. When the thickness of each of the second-first insulating layer 211, second-second insulating layer 212, and second-third insulating layer 213 is less than 3 $\mu$m, the second circuit pattern 220 formed on the second insulating layer 210 may not be stably protected. When the thickness of each of the second-first insulating layer 211, second-second insulating layer 212, and second-third insulating layer 213 exceeds 20 $\mu$m, it can be difficult to miniaturize the second circuit pattern 220.

The second substrate layer 200 can include a second circuit pattern 220.

The second circuit pattern 220 can be disposed on the first or upper surface of the second insulating layer 210.

For example, the second circuit pattern 220 can include a second-first circuit pattern 221 disposed on the first or upper surface of the second-first insulating layer 211. For example, the second-first circuit pattern 221 can protrude on the first or upper surface of the second-first insulating layer 211. The side and upper surfaces of the second-first circuit pattern 221 can be covered by the second-second insulating layer 212.

The second circuit pattern 220 can include a second-second circuit pattern 222. The second-second circuit pattern 222 can be disposed on the first or upper surface of the second-second insulating layer 212. The second-second circuit pattern 222 can protrude on the first or upper surface of the second-second insulating layer 212. The side and upper surfaces of the second-second circuit pattern 222 can be covered by the second-third insulating layer 213.

The second circuit pattern 220 can include a second-third circuit pattern 223. The second-third circuit pattern 223 can be disposed on the first or upper surface of the second-third insulating layer 213. Preferably, the second-third circuit pattern 223 can have a structure embedded in the first or upper surface of the second-third insulating layer 213. For example, when forming a via hole in the second-third insulating layer 213, a circuit pattern groove (described later) is formed on the first or upper surface of the second-third insulating layer 213 by controlling the amount of exposure and development, and the second-third circuit pattern 223 can be formed by filling the circuit pattern groove. Accordingly, in the embodiment, the second-third circuit pattern 223 disposed on the outermost side of the second substrate layer 200 can be stably protected. That is, the second-third circuit pattern 223 includes pads that will later be connected to the first processor chip and the second processor chip, and traces that connect the pads to each other. And, the trace of the second-third circuit pattern 223 can be an ultra-fine pattern as described above. At this time, when the trace of the second-third circuit pattern 223 has a structure that protrudes above the second-third insulating layer 213, the such as collapse of the trace, short circuit, and peeling from the insulating layer can occur due to various external factors. Accordingly, in the embodiment, the second-third circuit pattern 223 has a structure embedded in the second-third insulating layer 213 to solve the problems and improve reliability.

The layer structure of the second circuit pattern 220 can be different from that of the first circuit pattern 120. For example, the number of layers of the second circuit pattern 220 can be greater than the number of layers of the first circuit pattern 120. However, the number of layers of the second circuit pattern 220 can be greater than the number of layers of the first circuit pattern 120, but can have a thickness smaller than that of the first circuit pattern 120.

The second-first circuit pattern 221, the second-second circuit pattern 222, and the second-third circuit pattern 223 constituting the second circuit pattern 220 can each have a three-layer structure. For example, each of the second-first circuit pattern 221, the second-second circuit pattern 222, and the second-third circuit pattern 223 includes a first plating layer 220-1, a second plating layer 220-2 and a third plating layer 220-3. The first plating layer 220-1 and the second plating layer 220-2 can be a seed layer.

The first plating layer 220-1 can be a titanium (Ti) layer formed through a sputtering process. The first plating layer 220-1 can have a thickness of 0.01 μm to 0.15 μm. For example, the first plating layer 220-1 can have a thickness of 0.03 μm to 0.12 μm. For example, the first plating layer 220-1 can have a thickness of 0.05 μm to 0.10 μm. The first plating layer 220-1 can be a first seed layer formed to increase the adhesion between the second plating layer 220-2 and the third plating layer 220-3 and the second insulating layer 220.

The second plating layer 220-2 can be a copper (Cu) layer formed through a sputtering process. The second plating layer 220-2 can have a thickness of 0.01 μm to 0.35 μm. For example, the second plating layer 220-2 can have a thickness of 0.05 μm to 0.32 μm. For example, the second plating layer 220-2 can have a thickness of 0.1 μm to 0.3 μm. The second plating layer 220-2 can be a second seed layer formed for electroplating the third plating layer 220-3. In an embodiment, a sum of the thicknesses of the first plating layer 220-1 and the second plating layer 220-2 can be 0.5 μm or less. Preferably, the sum of the thicknesses of the first plating layer 220-1 and the second plating layer 220-2 can be 0.4 μm or less. More preferably, the sum of the thicknesses of the first plating layer 220-1 and the second plating layer 220-2 can be 0.3 μm or less. When the sum of the thicknesses of the first plating layer 220-1 and the second plating layer 220-2 exceeds 0.5 μm, it can be difficult to miniaturize the second circuit pattern 220. Specifically, the process of manufacturing the second circuit pattern 220 includes a seed layer removal process in which the first plating layer 220-1 and the second plating layer 220-2 are removed by etching. At this time, as the thickness of the first plating layer 220-1 and the second plating layer 220-2 increases, the etching amount in the seed layer etching process increases, so that overall miniaturization of the second circuit pattern 220 becomes difficult.

In the embodiment, the seed layer of the second circuit pattern 220 includes a first plating layer 220-1 and a second plating layer 220-2. At this time, the first plating layer 220-1 and the second plating layer 220-2 are formed by a sputtering process, and accordingly, the thickness of the first circuit pattern 120 can be reduced compared to the seed layer, so that the second circuit pattern 220 can be miniaturized.

The third plating layer 220-3 can be an electrolytic plating layer formed by electroplating the second plating layer 220-2 as a seed layer. The third plating layer 220-3 can have a thickness ranging from 2 μm to 12 μm. The third plating layer 220-3 can have a thickness ranging from 3 μm to 11 μm. The third plating layer 220-3 can have a thickness ranging from 4 μm to 10 μm.

When the thickness of the third plating layer 220-3 is less than 2 μm, in process of etching the seed layer, the third plating layer 220-3 is also etched, so that it can be difficult to normally implement the second circuit pattern 220. When the thickness of the third plating layer 220-3 is greater than 12 μm, it can be difficult to miniaturize the second circuit pattern 220.

The second circuit patterns 220 having the above-described layer structure can each have a thickness ranging from 3 μm to 13 μm. The second circuit patterns 220 having the above-described layer structure can each have a thickness ranging from 4 μm to 12 μm. The second circuit patterns 220 having the above-described layer structure can each have a thickness ranging from 5 μm to 11 μm. When the thickness of the second circuit pattern 220 is less than 5 μm, the resistance of the second circuit pattern can increase, which can deteriorate reliability in connection with the first and second processor chips. When the thickness of each of the first circuit patterns 220 exceeds 11 μm, it can be difficult to implement the fine pattern required for the second substrate layer.

The second circuit pattern 220 can be an ultra-fine pattern. For example, the second circuit pattern 220 can have a line width of 6 μm or less. For example, the second circuit pattern 220 can have a line width of 5 μm or less. For example, the second circuit pattern 220 can have a line width of 4 μm or less. The second circuit pattern 220 can have a spacing of 6 μm or less. The spacing can refer to the spacing between traces of the second circuit pattern disposed on the same layer. For example, the second circuit pattern 220 can have a spacing of 5 μm or less. For example, the second circuit pattern 220 can have a spacing of 4 μm or less.

Preferably, the second circuit pattern 220 can have a line width of 1 μm to 6 μm. The line width can refer to the line width of traces constituting the second circuit pattern 220. The second circuit pattern 220 can have a line width ranging from 1.2 μm to 5 μm. The second circuit pattern 220 can have a line width ranging from 1.5 μm to 4 μm. When the line width of the second circuit pattern 220 is less than 1 μm, as the resistance of the second circuit pattern 220 increases, normal communication with the processor chip can be difficult. In addition, when the line width of the second circuit pattern 220 is less than 1 µm, the second circuit pattern 220 can easily collapse, which can cause reliability problems. When the line width of the second circuit pattern 220 is greater than 6 µm, it can be difficult to connect a plurality of processor chips within a limited space. For example, when the line width of the second circuit pattern 220 is greater than 6 µm, it can be difficult to place all traces for connecting a plurality of processor chips within a limited space. For example, when the line width of the second circuit pattern 220 is greater than 6 µm, the space for arranging traces for connecting a plurality of processor chips increases, thereby increasing the overall size of the circuit board and the semiconductor package.

The second circuit pattern 220 can have a spacing ranging from 1 µm to 6 µm. The spacing can refer to the spacing between traces constituting the second circuit pattern 220. The second circuit pattern 220 can have a spacing ranging from 1.2 µm to 5 µm. The second circuit pattern 220 can have a spacing ranging from 1.5 µm to 4 µm. If the spacing between the second circuit patterns 220 is less than 1 µm, there is a problem in that adjacent traces are connected to each other and an electrical short occurs. For example, when the spacing between the second circuit patterns 220 is greater than 6 µm, it can be difficult to place all traces for connecting a plurality of processor chips within a limited space. For example, when the spacing between the second circuit patterns 220 is greater than 6 µm, the space for arranging traces for connecting a plurality of processor chips increases, thereby increasing the overall size of the circuit board and the semiconductor package.

Meanwhile, in the embodiment, the line width and the spacing of the second circuit pattern 220 described above can refer to the line width and the spacing of the second-third circuit pattern 223 disposed on the uppermost side of the second substrate layer 200. Also, the second-first circuit pattern 221 and the second-second circuit pattern 222 can have the same line width and the spacing as the second-third circuit pattern 223. However, the embodiment is not limited thereto, and the second-first circuit pattern 221 and the second-second circuit pattern 222 can have different line widths and spacings from that of the second-third circuit pattern 223. For example, the second-first circuit pattern 221 and the second-second circuit pattern 222 can have a line width and a spacing greater than that of the second-third circuit pattern 223. This will be explained in more detail below. Meanwhile, the second circuit pattern 220 further includes a pad in addition to the traces described above.

Specifically, as an example, the trace of the second-first circuit pattern 221 and the trace of the second-second circuit pattern 222 can have the same line width and the spacing as the trace of the second-third circuit pattern 223. As another example, the trace of the second-first circuit pattern 221 and the trace of the second-second circuit pattern 222 can have a line width and a spacing from that of the trace of the second-third circuit pattern 223. For example, the trace of the second-first circuit pattern 221 and the trace of the second-second circuit pattern 222 can have a line width and a spacing greater than that of the trace of the second-third circuit pattern 223.

In addition, as an example, the pad of the second-first circuit pattern 221 and the pad of the second-second circuit pattern 222 can have a width different from that of the pad of the second-third circuit pattern 223. For example, the pad of the second-first circuit pattern 221 and the pad of the second-second circuit pattern 222 can have a width greater than that of the pad of the second-third circuit pattern 223. This will be explained in detail below.

The second substrate layer 200 includes a second via 230 disposed on the second insulating layer 210. The second via 230 can be formed passing through one second insulating layer, or alternatively, can be formed passing through two or more second insulating layers.

The second via 230 includes a second-first via 231 that pass through the second-first insulating layer 211. The second-first via 231 can have a first surface connected to the lower surface of the second-first circuit pattern 221 and a second surface connected to the upper surface of the first-first circuit pattern 121.

The second via 230 includes a second-second via 232 that pass through the second-second insulating layer 212. The first surface of the second-second via 232 can be connected to the lower surface of the second-second circuit pattern 222, and the second surface can be connected to the upper surface of the second-first circuit pattern 221.

The second via 230 includes a second-third via 233 that pass through the second-third insulating layer 213. The first surface of the second-third via 233 can be connected to the lower surface of the second-third circuit pattern 223, and the second surface can be connected to the upper surface of the second-second circuit pattern 222.

The second-first via 231, the second-second via 232, and the second-third via 233 can have a same shape. For example, the second-first via 231, the second-second via 232, and the second-third via 233 have a trapezoidal shape where the width of the first side and the width of the second side are different from each other. Preferably, the width of the upper surface of each of the second-first via 231, the second-second via 232, and the second-third via 233 can be greater than the width of the lower surface of each of the second-first via 231, the second-second via 232, and the second-third via 233.

The second-first via 231, the second-second via 232, and the second-third via 233 can each have different widths. For example, a via located closest to the first substrate layer 100 among the second-first via 231, the second-second via 232, and the second-third via 233 can have a greatest width. For example, a via located furthest from the first substrate layer 100 among the second-first via 231, the second-second via 232, and the second-third via 233 (for example, a via closest to the processor chip to be placed later) can have a smallest width.

However, the second-first via 231, the second-second via 232, and the second-third via 233 can all have a width smaller than that of the first via 130. At this time, the widths of each of the second-first via 231, the second-second via 232, and the second-third via 233 described below can refer to the width of the upper surface of the second-first via 231, the second-second via 232, and the second-third via 233.

In the embodiment, the second-first via 231, the second-second via 232, and the second-third via 233 is formed in the second-first insulating layer 211, the second-second layer 212, and the second-third insulating layer 213 of the second insulating layer 210. At this time, as described above, the second-first insulating layer 211, the second-second insulating layer 212, and the second-third insulating layer 213 are composed of PID. Accordingly, the size of the second-first via 231, the second-second via 232, and the second-third via 233 can be smaller than the size of the first via 130 formed in the first insulating layer 110.

For example, the width of the second-first via 231, the second-second via 232, and the second-third via 233 can be less than $\frac{1}{2}$ of the width of the first via 130. For example, the width of the second-first via 231, the second-second via 232, and the second-third via 233 can be less than $\frac{1}{5}$ of the width of the first via 130. For example, the width of the second-first via 231, the second-second via 232, and the second-third via 233 can be less than ¹⁄₁₀ of the width of the first via 130.

Specifically, because the first via 130 is formed in the first insulating layer 110 made of prepreg, it can have a width of at least 15 μm.

On the other hand, since the second-first via 231, the second-second via 232, and the second-third via 233 are formed in the second insulating layer 210 composed of PID, it is possible to form its thickness down to the level of 1 μm.

As described above, the width of the second-first via 231, the second-second via 232, and the second-third via 233 can be ¹⁄₁₀ of the width of the first via 130. At this time, when all of the second-first via 231, the second-second via 232, and the second-third via 233 have a width of ¹⁄₁₀ of the width of the first via 130, signal transmission reliability can decrease. For example, the first-first via 131 and the second-first via 231 are connected to each other with the first-first circuit pattern 121 interposed therebetween. At this time, when the second-first via 231 has a width of ¹⁄₁₀ of the first-first via 131, resistance between the second-first via 231 and the first-first via 131 can increase, which can cause reliability problems. For example, in the above case, signal transmission loss due to noise can increase in the process of transmitting a signal from the second-first via 231 to the first-first via 131. And, when the transmitted signal is a signal with a high frequency (mm-Wave) band (e.g., 6 GHz, 28 GHz, 35 GHz) of 5G or higher (6G, 7G~etc.) or a higher frequency, more problems can occur in communication performance due to the signal transmission loss. Accordingly, the embodiment solves the problem of signal transmission loss as described above.

For example, the width of the second via 230 in the portion where the processor chip is mounted in the embodiment is set to have a fine width according to the specifications of terminals included in the processor chip. And, in an embodiment, the width of the second via 230 can gradually increase as it approaches the first substrate layer 100. And, the second-first via 231 of the second via 230 disposed closest to the first substrate layer 100 can have a width corresponding to the first via (e.g., first-first via 131) formed in the first substrate layer 100.

For example, as described above, the first-first via 131 can have a width ranging from 15 μm to 40 μm.

And, the second-first via 231 of the second via 230 disposed closest to the first-first via 131 in a vertical direction can have a width corresponding to the first-first via 131. For example, the width of the second-first via 231 can range from 4 μm to 20 μm. For example, the width of the second-first via 231 can range from 5 μm to 18 μm. For example, the width of the second-first via 231 can range from 6 μm to 16 μm. That is, the second-first via 231 is greater than the width of the first-first via 131 and smaller than the width of the second-third via 233 disposed on the uppermost side of the second substrate layer 200.

In addition, in an embodiment, the width of the second via 230 can gradually decrease as it moves away from the first-first via 131 in the vertical direction. Also, the second-third via 233 of the second via 230, which is furthest away from the first-first via 131, can have the smallest width. For example, the width of the second-third via 233 can be 1 μm to 6 μm. For example, the width of the second-third via 233 can be 1.2 μm to 5 μm. For example, the width of the second-third via 233 can be 1.5 μm to 4 μm. In an embodiment, when the width of the second-third via 233 is less than 1 μm, it can be difficult to implement the via, and further, signal transmission loss can increase due to an increase in skin effect. In addition, when the width of the second-third via 233 is greater than 6 μm, the mounting area for mounting the first processor chip and the second processor chip can increase, and accordingly, it can be difficult to install the first processor chip and the second processor chip and connect wires between them within a limited space.

Meanwhile, in an embodiment, the width of the second-second via 232 disposed between the second-first via 231 and the second-third via 233 can be smaller than the width of the second-first via 231 and greater than the width of the second-third via 233. For example, the width of the second-second via 232 can be a value between the widths of the second-first via 231 and the width of the second-third via 233. For example, the width of the second-second via 232 can range from 2 μm to 18 μm. For example, the width of the second-second via 232 can range from 3 μm to 15 μm. For example, the width of the second-second via 232 can range from 4 μm to 12 μm.

As described above, the embodiment allows the width of the second vias 230 included in the second substrate layer 200 to increase closer to the first substrate layer 100 and decrease farther away from first substrate layer 100. Accordingly, in the embodiment, signal transmission loss occurring between the processor chip and the first substrate layer can be minimized, and communication performance can be improved accordingly.

Meanwhile, a thickness T1 of the circuit board 300 in the embodiment can be smaller than the thickness t8 of the first package 10 in the comparative example.

Specifically, the thickness T1 of the circuit board 300 can be smaller than the thickness t8 of the first package 10 in the comparative example. For example, when the first substrate layer 100 of the circuit board 300 has a five-layer structure based on the number of layers of the first insulating layer and a three-layer structure based on the number of layers of the second insulating layer, the thickness T1 of the circuit board 300 can be 400 μm or less. For example, when the first substrate layer 100 of the circuit board 300 has a five-layer structure based on the number of layers of the first insulating layer and a three-layer structure based on the number of layers of the second insulating layer, the thickness T1 of the circuit board 300 can be 380 μm or less. For example, when the first substrate layer 100 of the circuit board 300 has a five-layer structure based on the number of layers of the first insulating layer and a three-layer structure based on the number of layers of the second insulating layer, the thickness T1 of the circuit board 300 can be 360 μm or less.

Meanwhile, in the embodiment, the first insulating layer 110 included in the first substrate layer 100 of the circuit board 300 can be composed of PID, which is the same photocurable resin as the insulating material of the second insulating layer 220 included in the second substrate layer 200.

However, when the entire insulating layer of the circuit board 300 is formed of PID, which is a photocurable resin, the product price can increase. That is, PID, which is the photocurable resin, is more expensive than prepreg, and accordingly, when the circuit board 300 is formed entirely of PID, the product price of the circuit board 300 and the semiconductor package including it can increase. In addition, when the first insulating layers 110 of the first substrate layer 100 are also formed as PID, problems can occur in the rigidity of the circuit board 300, and warpage properties can be reduced accordingly. Therefore, in the embodiment, the first substrate layer 100 is composed of a first insulating layer 110 made of prepreg.

Accordingly, the insulating layer disposed on the first outermost side (e.g., uppermost side) of the circuit board 300 of the embodiment is the second-third insulating layer 213 of the second substrate layer 200 and includes a photo-curable resin. Unlike this, the insulating layer disposed on the second outermost side (e.g., lowermost side) of the circuit board 300 is the first-third insulating layer 113 of the first substrate layer 100 and can include prepreg.

Hereinafter, the second circuit pattern 220 disposed on the second substrate layer 200 will be described in more detail.

FIG. 7 is a plan view of a second-third circuit pattern of FIG. 5, FIG. 8 is a plan view of a second-second circuit pattern of FIG. 5, and FIG. 9 is a plan view of a second-first circuit pattern of FIG. 5.

Referring to FIG. 7, the second substrate layer 200 includes a chip mounting region R1. In addition, the chip mounting region R1 includes a first mounting region MR1 in which a first chip is mounted, a second mounting region MR2 in which a second chip of a different type from the first chip is mounted, and a connection region CR connecting between the first mounting region M1 and the second mounting region MR2.

In addition, the second-third circuit pattern 223 can be disposed in the chip mounting region R1. The second-third circuit pattern 223 can refer to an outermost circuit pattern disposed on the outermost side among the second circuit patterns 220 included in the second substrate layer 200.

The second-third circuit pattern 223 includes a first pad 223P1 disposed in the first mounting region MR1, a second pad 223P2 disposed in the second mounting region MR2, and a trace 223T1 disposed in the connection region CR to connect between the first pad 223P1 and the second pad 223P2.

The first pad 223P1 can correspond to a first chip (e.g., a first processor chip) disposed in the first mounting region MR1. For example, the first pad 223P1 can correspond to a terminal included in the first chip.

The second pad 223P2 can correspond to a second chip (e.g., a second processor chip) disposed in the second mounting region MR2. For example, the second pad 223P2 can correspond to a terminal included in the second chip.

The trace 223T1 can connect between the first pad 223P1 and the second pad 223P2. Specifically, a specific terminal of the first chip connected to the first pad 223P1 and a specific terminal of the second chip connected to the second pad 223P2 are connected to each other, and accordingly, mutual signals must be exchanged. Accordingly, the trace 223T1 connects the first pad 223P1 and the second pad 223P2 to enable communication between the first chip and the second chip.

The first pad 223P1 can have a first width W1. The first width W1 can correspond to a width of the second-third via 233 connected to the first pad 223P1. For example, the first width W1 of the first pad 223P1 can be 1 μm to 10 μm. For example, the first width W1 of the first pad 223P1 can be 1.5 μm to 9 μm. For example, the first width W1 of the first pad 223P1 can be 2 μm to 8 μm. However, in order to increase the connection reliability between the first pad 223P1 and the second-third via 233, the first pad 223P1 can have a first width W1 greater than that of the second-third via 233 within the range described above.

The second pad 223P2 can have a second width W2. The second width W2 can correspond to a width of the second-second via 232 connected to the second pad 223P2. For example, the second width W2 of the second pad 223P2 can have a range of 1 μm to 10 μm. For example, the second width W2 of the second pad 223P2 can have a range of 1.5

μm to 9 μm. For example, the second width W2 of the second pad 223P2 can have a range of 2 μm to 8 μm. However, in order to increase connection reliability with the second-third via 233, the second pad 223P2 can have a second width W2 greater than that of the second-third via 233 within the range described above.

Meanwhile, the first width W1 of the first pad 223P1 can correspond to the second width W2 of the second pad 223P2. Preferably, the first width W1 of the first pad 223P1 can be equal to the second width W2 of the second pad 223P2.

The trace 223T1 connecting the first pad 223P1 and the second pad 223P2 can be divided into a plurality of parts. Here, the division into a plurality of parts only means division according to an arrangement position of the trace 223T1, and does not mean that the trace 223T1 is physically separated or formed through different or separate processes.

The trace 223T1 includes a first portion 223T1a disposed in the first mounting region MR1 and connected to the first pad 223P1. In addition, the trace 223T1 includes a second portion 223T1b disposed in the second mounting region MR2 and connected to the second pad 223P2. In addition, the trace 223T1 can include a third portion 223T1c disposed in the connection region CR to connect the first portion 223T1a and the second portion 223T1b.

At this time, as described above, the trace 223T1 needs to be ultra-fine for mounting the first chip, mounting the second chip, and connecting the first chip and the second chip within a limited space. To this end, in the embodiment, the second insulating layer 210 is formed as a PID to achieve ultra-fine of the trace 223T1.

Preferably, the trace 223T1 can have a first line width W3. For example, the first line width W3 of the trace 223T1 can satisfy a range of 1 μm to 6 μm. For example, the first line width W3 of the trace 223T1 can satisfy a range of 1.2 μm to 5 μm. For example, the first line width W3 of the trace 223T1 can satisfy a range of 1.5 μm to 4 μm. When the first line width W3 of the trace 223T1 is less than 1 μm, the resistance of the trace 223T1 increases and normal communication with processor chips can be difficult. In addition, when the first line width W3 of the trace 223T1 is less than 1 μm, it is difficult to implement this, and reliability problems can occur in which the trace 223T1 easily collapses due to various factors. When the first line width W3 of the trace 223T1 is greater than 6 μm, it can be difficult to connect a plurality of processor chips within a limited space. For example, when the first line width W3 of the trace 223T1 is greater than 6 μm, it can be difficult to place all traces for connecting a plurality of processor chips within a limited space. For example, when the first line width W3 of the trace 223T1 is greater than 6 μm, the space for arranging traces for connecting a plurality of processor chips within the connection region CR increases, and accordingly, the overall size of the circuit board and semiconductor package can increase.

Meanwhile, the trace 223T1 can have a first spacing W4. The first spacing W4 can refer to the spacing between the traces 223T1. The first spacing W4 of the trace 223T1 can have a range of 1 μm to 6 μm. The first spacing W4 of the trace 223T1 can have a range of 1.2 μm to 5 μm. The first spacing W4 of the trace 223T1 can have a range of 1.5 μm to 4 μm. When the first spacing W4 of the trace 223T1 is less than 1 μm, there is a problem in that adjacent traces are connected to each other and an electrical short occurs. For example, when the first spacing W4 of the trace 223T1 is greater than 6 μm, it can be difficult to place all traces for connecting a plurality of processor chips within a limited space.

Referring to FIG. 8, the second-second circuit pattern 222 can include a pad 222P and a trace 222T. The pad 222P of the second-second circuit pattern 222 can be a pad connected to the second-third via 233 and/or the second-second via 232.

The pad 222P of the second-second circuit pattern 222 can have a fifth width W5 different from that of the first pad 223P1 and the second pad 223P2 of the second-third circuit pattern 223. For example, the fifth width W5 of the pad 222P of the second-second circuit pattern 222 can be greater than the first width W1 of the first pad 223P1 of the second-third circuit pattern 223 and the second width W2 of the second pad 223P2.

For example, the pad 222P of the second-second circuit pattern 222 can correspond to the width of the second-second via 232. The fifth width W5 of the pad 222P of the second-second circuit pattern 222 can have a range of 2 μm to 18 μm. For example, the fifth width W5 of the pad 222P of the second-second circuit pattern 222 can have a range of 3 μm to 15 μm. For example, the fifth width W5 of the pad 222P of the second-second circuit pattern 222 can have a range of 4 μm to 12 μm. However, in order to increase the connection reliability with the second-second via 232, the pad 222P of the second-second circuit pattern 222 can have a fifth width W5 greater than that of the second-second via 232 within the range described above.

Meanwhile, as an example, the trace 222T of the second-second circuit pattern 222 can have a second line width W6 and a second spacing W7 corresponding to the trace 223T1 of the second-third circuit pattern 223. For example, the second line width W6 of the trace 222T of the second-second circuit pattern 222 can correspond to the first line width W3 of the trace 223T1 of the second-third circuit pattern 223. For example, the second spacing W7 of the trace 222T of the second-second circuit pattern 222 can correspond to the first spacing W4 of the trace 223T1 of the second-third circuit pattern 223.

As another example, the trace 222T of the second-second circuit pattern 222 can have a second line width W6 and a second spacing W7 different from that of the trace 223T1 of the second-third circuit pattern 223. For example, the second line width W6 of the trace 222T of the second-second circuit pattern 222 can be greater than the first line width W3 of the trace 223T1 of the second-third circuit pattern 223.

That is, in the embodiment, the line width and the spacing of the second circuit pattern 220 formed on the second insulating layer 210 are smaller than the line width and the spacing of the first circuit pattern 120 formed on the first insulating layer 110. Accordingly, in this embodiment, the line width and the spacing of the second circuit pattern 220 can gradually increase as it approaches the first substrate layer 100 to correspond to the first via and the second via.

For example, the second line width W6 of the trace 222T of the second-second circuit pattern 222 can satisfy a range of 2 μm to 11 μm. For example, the second line width W6 of the trace 222T of the second-second circuit pattern 222 can satisfy a range of 2.5 μm to 10 μm. For example, the second line width W6 of the trace 222T of the second-second circuit pattern 222 can satisfy a range of 3 μm to 9 μm.

For example, the second spacing W7 of the trace 222T of the second-second circuit pattern 222 can satisfy a range of 2 μm to 11 μm. For example, the second spacing W7 of the trace 222T of the second-second circuit pattern 222 can satisfy a range of 2.5 μm to 10 μm. For example, the second spacing W7 of the trace 222T of the second-second circuit pattern 222 can satisfy a range of 3 μm to 9 μm.

Referring to FIG. 9, the second-first circuit pattern 221 can include a pad 221P and a trace 221T. The pad 221P of the second-first circuit pattern 221 can be a pad connected to the second-second via 232 and/or the second-first via 231.

The pad 221P of the second-first circuit pattern 221 can have an eighth width W8 different from that of the pad 222P of the second-second circuit pattern 222.

For example, the eighth width W8 of the pad 221P of the second-first circuit pattern 221 can be greater than the fifth width W5 of the pad 222P of the second-second circuit pattern 222. there is. For example, the pad 221P of the second-first circuit pattern 221 can correspond to the width of the second-first via 231.

For example, the eighth width W8 of the pad 221P of the second-first circuit pattern 221 can have a range of 3 μm to 20 μm. For example, the eighth width W8 of the pad 221P of the second-first circuit pattern 221 can have a range of 4 μm to 18 μm. For example, the eighth width W8 of the pad 221P of the second-first circuit pattern 221 can range from 5 μm to 16 μm. However, in order to increase the connection reliability with the second-first via 231, the eighth width W8 of the pad 221P of the second-first circuit pattern 221 can be greater than the width of the second-second via 231 within the range described above.

Meanwhile, as an example, the trace 221T of the second-first circuit pattern 221 can have a third line width W9 and a third spacing W10 corresponding to that of the trace 222T of the second-second circuit pattern 222 and the trace 223T1 of the second-third circuit pattern 223. For example, the third line width W9 of the trace 221T of the second-first circuit pattern 221 can correspond to the first line width W3 of the trace 223T1 of the second-third circuit pattern 223. For example, the third spacing W10 of the trace 221T of the second-first circuit pattern 221 can correspond to the first spacing W4 of the trace 223T1 of the second-third circuit pattern 223.

As another example, the trace 221T of the second-first circuit pattern 221 can have a third line width W9 and a third spacing W10 different from that of the trace 222T of the second-second circuit pattern 222 and the trace 223T1 of the second-third circuit pattern 223. For example, the third line width W9 of the trace 221T of the second-first circuit pattern 221 can be greater than the line width of the trace 222T of the second-second circuit pattern 222 and the line width of the trace 223T1 of the second-third circuit pattern 223.

That is, in the embodiment, the line width and the spacing of the second circuit pattern 220 formed on the second insulating layer 210 are smaller than the line width and the spacing of the first circuit pattern 120 formed on the first insulating layer 110. Accordingly, in the embodiment, the line width and the spacing of the second circuit pattern 220 can gradually increase as it approaches the first substrate layer 100 to correspond to the first via and the second via.

For example, the third line width W9 of the trace 221T of the second-first circuit pattern 221 can satisfy a range of 3 μm to 13 μm. For example, the third line width W9 of the trace 221T of the second-first circuit pattern 221 can satisfy a range of 4 μm to 11 μm. For example, the third line width W9 of the trace 221T of the second-first circuit pattern 221 can satisfy a range of 5 μm to 10 μm.

For example, the third spacing W10 of the trace 221T of the second-first circuit pattern 221 can satisfy a range of 3 μm to 13 μm. For example, the third spacing W10 of the trace 221T of the second-first circuit pattern 221 can satisfy a range of 4 μm to 11 μm. For example, the third spacing W10 of the trace 221T of the second-first circuit pattern 221 can satisfy a range of 5 μm to 10 μm.

Meanwhile, as described above, the second substrate layer 200 is composed of at least two layers in order to minimize the numerical difference from the first substrate layer. At this time, when the second substrate layer 200 is composed of two layers, the second insulating layer 210 can include only the second-first insulating layer 211 and the second-second insulating layer 212. In addition, when the second substrate layer 200 has a two-layer structure, the characteristics of the second-third circuit pattern 223 and the second-third via 233 described above can be characteristics of the second-second circuit pattern 222 and the second-second via 232.

As described above, the embodiment includes a first substrate layer 100 and a second substrate layer 200.

The first substrate layer 100 includes a prepreg, and thus maintains the rigidity of the circuit board 300 to improve warpage properties and improve product reliability. Furthermore, the first substrate layer 100 is connected to the main board of the electronic device, and accordingly, the first substrate layer 100 includes the first circuit pattern 120 and the first via 130 of a standard corresponding to a connection pad (not shown) of the electronic device.

Furthermore, the second substrate layer 200 includes a PID, thereby improving connection reliability with a plurality of processor chips. That is, the second substrate layer 200 includes a second circuit pattern 220 connected to a plurality of processor chips, and accordingly, it is possible to ultrafine the pads and traces of the second circuit pattern 220 to correspond to the terminals of the plurality of processor chips. Furthermore, the width of the second circuit pattern 220 and the second via 230 disposed on the second substrate layer 200 can gradually increase as it approaches the first substrate layer 100. Accordingly, the embodiment can minimize signal transmission loss between the first substrate layer 100 and the second substrate layer 200 and further improve communication performance.

Hereinafter, a method of manufacturing a circuit board according to an embodiment will be described.

FIGS. 10 to 29 are views for explaining a method of manufacturing the circuit board of FIG. 2 in order of processes.

The method of manufacturing the circuit board of the embodiment can be divided into a first process of manufacturing the first substrate layer 100 and a second process of manufacturing the second substrate layer 200 on the manufactured first substrate layer 100.

Referring to FIG. 10, the embodiment can proceed with a process of preparing basic materials for manufacturing the first substrate layer 100 using the ETS method. For this purpose, in the embodiment, a carrier board CB can be prepared. The carrier board CB can include a carrier insulating layer CB1 and a carrier metal layer CB2 disposed on at least one surface of the carrier insulating layer CB1. At this time, the drawing shows that the carrier metal layer CB2 is disposed only on the first surface of the carrier insulating layer CB1, but it is not limited thereto. For example, in the embodiment, the carrier metal layer CB2 can be formed on both the first surface of the carrier insulating layer CB1 and the second surface opposite to the first surface of the carrier board CB. In addition, when the carrier metal layer is formed on both surfaces of the carrier insulating layer CB1, the process of manufacturing the first substrate layer 100 described below can be performed on both sides of the carrier board CB. For example, the embodiment can form a plurality of first substrate layers at once by performing the following processes on the upper and lower sides of the carrier board CB. For example, the embodiment can form a plurality of first substrate layers at once by performing the following processes on the upper and lower sides of the carrier board CB. Hereinafter, for convenience of explanation, the explanation will be that the carrier metal layer CB2 is formed only on one side of the carrier insulating layer CB1, and then the manufacturing process of the first substrate layer is performed only on one side of the carrier board CB.

The carrier metal layer CB2 can be formed by electroless plating on the carrier insulating layer CB1. In addition, the embodiment can use Copper Clad Laminate (CCL) as the carrier board CB.

Next, the embodiment can proceed with a process of forming the first metal layer 610 on the carrier metal layer CB2. The first metal layer 610 can be formed to have a certain thickness on the carrier metal layer CB2 by performing a chemical copper plating process.

Next, as shown in FIG. 11, the embodiment can proceed with a process of forming the first mask 620 on the first metal layer 610. At this time, a first mask 620 can be formed to cover an entire first surface of the first metal layer 610. In addition, and the first mask 620 can include an opening (not shown) that partially exposes the surface of the first metal layer 610 through a later opening process. That is, the first mask 620 can include an opening (not shown) that opens a region of the first surface of the first metal layer 610 where the first-first circuit pattern 121 will be formed.

Next, as shown in FIG. 12, the embodiment can proceed with a process of forming the first-first circuit pattern 121 that fills the opening of the first mask 620 by performing electrolytic plating using the first metal layer 610 as a seed layer.

Next, as shown in FIG. 13, the embodiment can proceed with a process of removing the first mask 620 disposed on the first metal layer 610. In addition, the embodiment can proceed with a process of forming a first-first insulating layer 111 covering the first-first circuit pattern 121 on the first metal layer 610. The first-first insulating layer 111 can include the prepreg.

Next, as shown in FIG. 14, the embodiment can proceed with a process of forming a first-first via hole VH1 in the first-first insulating layer 111. The first-first via hole VH1 can be formed through a laser process to open the resin and reinforcing fibers constituting the first-first insulating layer 111.

Next, as shown in FIG. 15, the embodiment can proceed with a process of forming seed layers 131-1 and 122-1 on the surface of the first-first insulating layer 111 and the inner wall of the first-first via hole VH1. The seed layers 131-1 and 122-1 can be formed by a chemical copper plating process, but the embodiment is not limited thereto.

Next, as shown in FIG. 16, the embodiment can proceed with a process of forming a second mask 630 on the seed layer 122-1 formed on the surface of the first-first insulating layer 111. At this time, the second mask 630 can include at least one opening (not shown). For example, the second mask 630 can include an opening exposing a region where the first-first via 131 will be formed and an opening exposing a region where the first-second circuit pattern 122 will be formed.

Next, as shown in FIG. 17, the embodiment can proceed with a process of forming electrolytic plating layers 131-2 and 122-2 that fill the openings of the second mask 630 by performing electrolytic plating using the seed layers 131-1 and 122-1. At this time, the seed layer 131-1 and the electrolytic plating layer 131-2 can form the first-first via 131. In addition, the seed layer 121-1 and the electrolytic plating layer 121-2 can form the first-second circuit pattern 122.

Next, as shown in FIG. 18, the embodiment can proceed with a process of removing the second mask 630 and a process of etching the seed layer 122-1. For example, the embodiment can proceed with a seed layer etching process to remove a portion of the seed layer 122-1 that does not overlap the electrolytic plating layer 122-2 in a vertical direction.

Next, as shown in FIG. 19, the embodiment can proceed with a process of forming a multi-layered first substrate layer 100 by repeating the processes of FIGS. 11 to 18.

For example, the embodiment can proceed with a process of forming a first-second insulating layer 112 on the first-first insulating layer 111. In addition, the embodiment can proceed with a process of forming the first-second via 132 and the first-third circuit pattern 123 on the first-second insulating layer 112. For example, the embodiment can proceed with a process of forming a first-third insulating layer 113 on the first-second insulating layer 112. In addition, the embodiment can proceed with a process of forming the first-third via 133 and the first-fourth circuit pattern 124 on the first-third insulating layer 113.

Next, as shown in FIG. 20, when manufacturing of the first substrate layer 100 is completed, the embodiment can proceed with a process of removing the carrier board CB. In addition, when the carrier board CB is removed, the embodiment can proceed with a process of removing the first metal layer 610, which is the seed layer of the first-first circuit pattern 121 formed on the first-first insulating layer 111. As described above, in the embodiment, the first substrate layer 100 can be manufactured by performing the process of FIGS. 10 to 20.

Next, as shown in FIG. 21, the embodiment can proceed with a process of laminating the second-first insulating layer 211 on the first-first insulating layer 111 of the first substrate layer 100. At this time, the second-first insulating layer 211 can include an insulating material different from that of the first-first insulating layer 111. For example, the second-first insulating layer 211 can include a PID. The second-first insulating layer 211 can be disposed to cover the ETS pattern of the first substrate layer 100. Specifically, the second-first insulating layer 211 can be disposed to cover the first surface of the first-first insulating layer 111 and the first surface of the first-first circuit pattern 121.

Meanwhile, the embodiment can proceed with a process of forming a carrier film (CF) on the side of the first substrate layer 100 opposite to the side where the second-first insulating layer 211 will be disposed. For example, in an embodiment, the carrier film CF can be formed on the second surface of the first-third insulating layer 113 of the first substrate layer 100. The carrier film CF can protect the first-third insulating layer 113 and the first-third circuit pattern 123 during a process of manufacturing the second substrate layer 200, which is performed below.

Next, as shown in FIG. 22, the embodiment can proceed with a process of exposing the second-first insulating layer 211. To this end, in the embodiment, a third mask 650 can be formed on the second-first insulating layer 211. At this time, the third mask 650 can include an opening (not shown) corresponding to a region where the second-first via 231 will be formed. Thereafter, the embodiment can proceed with a process of exposing a partial region A of the second-first insulating layer 211 exposed through the opening of the third mask 650.

Next, as shown in FIG. 23, the embodiment can proceed with a process of developing the region A and then proceed with a process of removing the partial region A. In addition, in the embodiment, as the partial region A is removed, a second-first via hole VH2 can be formed in the second-first insulating layer 211.

Next, as shown in FIG. 24, the embodiment can proceed with a process of forming a third mask 650 on the first-first insulating layer 211 and a plating process of filling the opening of the third mask 650. That is, the embodiment can proceed with a process of forming the second-first via 231 and the second-first circuit pattern 221. At this time, the manufacturing process of the second-first via 231 and the second-first circuit pattern 221 can include performing a process of sequentially forming the first plating layer 220-1 containing titanium, the second plating layer 220-2 containing copper, and the third plating layer 220-3 containing copper, as described above.

Next, as shown in FIG. 25, the embodiment can proceed with a process of removing the third mask 650. Next, the embodiment can proceed with a process of forming the second-second insulating layer 212 on the second-first insulating layer 211. Next, the embodiment can proceed with a process of forming the second-second via 232 and the second-second circuit pattern 222 on the second-second insulating layer 212. Next, the embodiment can proceed with a process of forming a second-third insulating layer 213 on the second-second insulating layer 212.

Next, as shown in FIG. 26, the embodiment can proceed with a process of forming the second-third via hole VH3 in the second-third insulating layer 213 by performing a first exposure and development process.

Next, as shown in FIG. 27, the embodiment can proceed with a process of forming pattern grooves PG on the surface of the second-third insulating layer 213 by performing a secondary exposure and development process. At this time, conditions of the first exposure and development can be different from conditions of the second exposure and development. For example, the first exposure and development can be performed under conditions for forming a second-third via hole (VH3) passing through the second-third insulating layer 213. For example, the secondary exposure and development can be performed under conditions for forming pattern grooves PG having a certain depth on the surface of the second-third insulating layer 213. Meanwhile, the embodiment can simultaneously proceed with the process of forming the second-third via hole VH3 and the pattern groove PG using a mask (not shown) with different transmittances for each region.

Next, as shown in FIG. 28, by performing a plating process to fill the second-third via hole VH3 and the pattern groove PG, the embodiment can proceed with a process of forming the second-third via 233 and the second-third circuit pattern 223 on the outermost side of the second substrate layer 200.

Next, as shown in FIG. 29, the embodiment can proceed with a process of removing the carrier film CF formed on the lower side of the first substrate layer 100 and a process of forming a protective layer 140 including an opening on the second surface of the first-third insulating layer 113.

FIG. 30 is a view showing a semiconductor package according to a first embodiment.

Referring to FIG. 30, the embodiment can have a structure in which a plurality of chips are mounted on the circuit board 300 of FIG. 2.

For example, the semiconductor package 500 can include a first adhesive part 410 disposed on the first pad 223P1 of the second-third circuit pattern 223 disposed on the outermost side of the second substrate layer 200. In addition, the semiconductor package 500 can include a second adhesive part 440 disposed on the second pad 223P2 of the second-third circuit pattern 223 disposed on the outermost side of the second substrate layer 200.

The first adhesive part 410 and the second adhesive part 440 can have a same shape or different shapes.

For example, the first adhesive part 410 and the second adhesive part 440 can have a hexahedral shape. For example, cross-sections of the first adhesive part 410 and the second adhesive part 440 can have a rectangular shape. Cross sections of the first adhesive part 410 and the second adhesive part 440 can include a rectangular or square shape. For example, the first adhesive part 410 and the second adhesive part 440 can have a spherical shape. For example, cross-sections of the first adhesive part 410 and the second adhesive part 440 can include a circular shape or a semicircular shape. For example, cross-sections of the first adhesive part 410 and the second adhesive part 440 can include a partially or entirely rounded shape. The cross-sectional shape of the first adhesive part 410 and the second adhesive part 440 can be flat on one side and curved on the other side. The first adhesive part 410 and the second adhesive part 440 can be solder balls, but are not limited thereto.

The embodiment can include a first chip 420 disposed on the first adhesive part 410. The first chip 420 can be a first processor chip. For example, the first chip 420 can be any one an application processor (AP) chip selected from a central processor (e.g., CPU), graphics processor (e.g., GPU), digital signal processor, cryptographic processor, microprocessor, or microcontroller. The terminal 425 of the first chip 420 can be electrically connected to the first pad 223P1 through the first adhesive part 410.

In addition, the embodiment can include a second chip 450 disposed on the second adhesive part 440. The second chip 450 can be a second processor chip. For example, the second chip 450 can be a different type of application processor (AP) chip than the first chip 420, selected from a central processor (e.g., CPU), graphics processor (e.g., GPU), digital signal processor, cryptographic processor, microprocessor, and microcontroller. The terminal 455 of the second chip 450 can be electrically connected to the second pad 223P2 through the second adhesive part 440.

For example, the first chip 420 can be a central processor chip, and the second chip 450 can be a graphics processor chip, but are not limited thereto.

Meanwhile, the first chip 420 and the second chip 450 can be disposed on the circuit board 300 with a first separation distance D1. The first separation distance D1 can be 150 μm or less. For example, the first separation distance D1 can be 120 μm or less. For example, the first separation distance D1 can be 100 μm or less.

Preferably, the first separation distance D1 can have a range of 60 μm to 150 μm. Preferably, the first separation distance D1 can have a range of 70 μm to 120 μm. Preferably, the first separation distance D1 can have a range of 80 μm to 110 μm. When the first separation distance D1 is less than 60 μm, interference between the first chip 420 and the second chip 420 can occur and problems can occur in the operational reliability of the first chip 420 or the second chip 420. When the first separation distance D1 is less than 60 μm, it may not be possible to place all of the wiring for connecting the first chip 420 and the second chip 420 in the space corresponding to the first separation distance D1. When the first separation distance D1 is greater than 150 μm, signal transmission loss can increase as the distance between the first chip 420 and the second chip 450 increases. When the first spacing distance D1 is greater than 150 μm, the volume of the semiconductor package 500 can increase.

The semiconductor package 500 can include a first fillet layer 430 and a second fillet layer 460. The first fillet layer 430 can be disposed to surround the first substrate layer 100 and the terminal 425 of the first chip 420. The first fillet layer 430 can prevent foreign substances (e.g., moisture) from penetrating into a space between the circuit board and the first chip 420. The second fillet layer 460 can be disposed to surround the first substrate layer 100 and the terminal 455 of the second chip 450. The second fillet layer 460 can prevent foreign substances (e.g., moisture) from penetrating into a space between the circuit board and the second chip 450.

The semiconductor package 500 can include a molding layer 470. The molding layer 470 can be disposed to cover the first chip 420 and the second chip 450. For example, the molding layer 470 can be an epoxy mold compound (EMC) formed to protect the mounted first chip 420 and the second chip 450, but is not limited thereto.

The molding layer 470 can directly contact the first surface of the second-third insulating layer 213 disposed on the uppermost side of the circuit board. Here, no solder resist is disposed on the first surface of the second-third insulating layer 213, and accordingly, the first surface of the second-third insulating layer 213 can be in direct contact with the molding layer 470. At this time, the molding layer 470 can have a low dielectric constant to increase heat dissipation properties. For example, the dielectric constant (Dk) of the molding layer 470 can be 0.2 to 10. For example, the dielectric constant (Dk) of the molding layer 470 can be 0.5 to 8. For example, the dielectric constant (Dk) of the molding layer 470 can be 0.8 to 5. Accordingly, in the embodiment, the molding layer 470 has a low dielectric constant to improve heat dissipation properties for heat generated from the first chip 420 and/or the second chip 450.

Meanwhile, the semiconductor package 500 can include a third adhesive part 480 disposed on the lowermost side of the circuit board 300. The third adhesive part 480 can be disposed on the second or lower surface of the first-fourth circuit pattern 124 exposed through the protective layer 140.

FIG. 31 is a view showing a circuit board according to a second embodiment, FIG. 32 is a view showing a second substrate layer of FIG. 31, and FIG. 33 is a plan view of an outermost side of a second substrate layer of FIG. 32.

Referring to FIGS. 31 to 33, a circuit board 300a according to the second embodiment can be that the chip mounting region (R1) further includes a third mounting region (MR3) compared to the circuit board 300 according to the first embodiment.

For example, the circuit board 300 according to the first embodiment provides two mounting regions in which a plurality of different types of processor chips are mounted. For example, the circuit board 300 of the first embodiment can be a substrate to replace the first package 10 of the comparative example.

Unlike this, the circuit board 300a according to the second embodiment can provide at least three mounting regions where at least one memory chip is disposed along with a plurality of different types of processor chips. For example, the circuit board 300 of the second embodiment can be a substrate to replace the first package 10 and the second package 20 of the comparative example.

The circuit board 300a can include a first substrate layer 100a and a second substrate layer 200a.

The basic characteristics of the first substrate layer 100*a* and the second substrate layer 200*a* are substantially the same as the first substrate layer 100 and the second substrate layer 200 of FIG. 2, and detailed description thereof will be omitted.

The chip mounting region R1 of the second substrate layer 200*a* includes a first mounting region MR1 on which a first processor chip is mounted, a second mounting region MR2 on which a second processor chip of a different type from the first processor chip is mounted, and a third mounting region (MR3) on which the first memory chip is mounted, a first connection region CR1 connecting between the first mounting region MR1 and the second mounting region MR2 and a second connection region CR2 connecting the first mounting region MR1 and the third mounting region MR3.

That is, the embodiment provides a circuit board 300*a* on which both a plurality of processor chips and at least one memory chip can be mounted. This can be achieved by making the circuit patterns of the second substrate layer (200*a*) ultrafine by including the PID in the insulating layer that constitutes the second substrate layer 200*a*.

The second-third circuit pattern 223 included in the second substrate layer 200*a* of the embodiment includes a third pad 223P3 disposed in the third mounting region MR3. The third pad 223P3 of the second-third circuit pattern 223 included in the third mounting region MR3 can have the same width W11 as the width of the first pad 223P1 or the second pad 223P2. For example, the third pad 223P3 can have an eleventh width W11. The eleventh width W11 can correspond to the width of the second-third via 233 connected to the third pad 223P3. For example, the eleventh width W11 of the third pad 223P3 can be 1 μm to 10 μm. For example, the eleventh width W11 of the third pad 223P3 can be 1.5 μm to 9 μm. For example, the eleventh width W11 of the third pad 223P3 can be 2 μm to 8 μm.

In addition, the second-third circuit pattern 223 included in the second substrate layer 200*a* of the embodiment can include a trace 223T2 in the second connection region CR2 connecting the first pad 223P1 and the third pad 223P3.

At this time, in one embodiment, the trace 223T1 disposed in the first connection region CR1 can have the same line width or spacing as the line width or the spacing the trace 223T2 disposed in the second connection region CR2.

In addition, in another embodiment, the trace 223T1 disposed in the first connection region CR1 can have a line width or spacing different from the line width or the spacing of the trace 223T2 disposed in the second connection region CR2. That is, the trace 223T1 disposed in the first connection region CR1 must be ultra-fine as described above for connection between the first processor chip and the second processor chip. Unlike this, in the second connection region CR2, a connection is made between the first processor chip and the memory chip. At this time, the number of connection wires in the second connection region CR2 is smaller than the number of connection wires in the first connection region CR1. Accordingly, the trace 223T2 in the second connection region CR2 may not require a line width or spacing as fine as the trace 223T1 in the first connection region CR1.

Accordingly, the trace 223T2 in the second connection region CR2 can have a line width and spacing that are greater than the line width and spacing of the trace 223T1 in the first connection region CR1.

For example, the trace 223T1 in the first connection region CR1 can have a line width in a range of 1 μm to 6 μm, or 1.2 μm to 5 μm, or 1.5 μm to 4 μm.

In contrast, the line width W12 of the trace 223T2 in the second connection region CR2 can satisfy a range of 2 μm to 11 μm. For example, the line width W12 of the trace 223T2 in the second connection region CR2 can satisfy a range of 2.5 μm to 10 μm. For example, the line width W12 of the trace 223T2 in the second connection region CR2 can satisfy a range of 3 μm to 8 μm.

That is, the embodiment can allow the second-third circuit pattern disposed on the outermost side of the second substrate layer to have different line widths and spacings depending on the function. Specifically, the embodiment allows the second-third circuit pattern in the first connection region CR1 to have a line width and spacing in the first range as described above, and allow the second-third circuit pattern in the second connection region CR2 to have a line width and spacing in a second range that is greater than the first range.

FIG. 34 is a view showing a semiconductor package according to a second embodiment.

Referring to FIG. 34, the semiconductor package 500*a* further includes a memory chip mounting part compared to the semiconductor package 500 according to the first embodiment.

Specifically, the semiconductor package 500*a* includes a memory chip 490 arranged side by side with the first chip 420 and spaced apart from the first chip 420 by a predetermined distance. At this time, the memory chip 490 can have a multi-layer structure with an adhesive layer 492 interposed therebetween. In addition, the semiconductor package 500*a* can include a connection member 494 connected to the memory chip 490. The connection member 494 can be a wire, but is not limited thereto.

The thickness T2 of the semiconductor package 500*a* in the embodiment can be smaller than the thickness (t8+t9) of the semiconductor package in the comparative example. The thickness T2 of the semiconductor package 500*a* can be 95% of the thickness (t8+t9) of the semiconductor package in the comparative example. The thickness T2 of the semiconductor package 500*a* can be 90% of the thickness (t8+t9) of the semiconductor package in the comparative example. The thickness T2 of the semiconductor package 500*a* can be 85% of the thickness (t8+t9) of the semiconductor package in the comparative example.

For example, the thickness T2 of the semiconductor package 500*a* can be less than 1000 μm. For example, the thickness T2 of the semiconductor package 500*a* can be less than 900 μm. For example, the thickness T2 of the semiconductor package 500*a* can be less than 850 μm.

In the semiconductor package of the embodiment, a chip is mounted on a circuit board. At this time, the circuit board includes a first substrate layer and a second substrate layer. The second substrate layer can include a PID and, accordingly, can include a fine pattern with a line width and a spacing corresponding to a plurality of different processor chips mounted on the circuit board. Accordingly, the embodiment can allow a plurality of different processor chips to be mounted on one circuit board, and further can allow easy connection between the plurality of processor chips within a limited space. Accordingly, the embodiment can be possible to improve the performance of an application processor by separating the plurality of processor chips according to function. Furthermore, the embodiment can easily connect the plurality of processor chips within a limited space, thereby reducing an overall volume of the semiconductor package and thereby slimming the electronic device.

In addition, the embodiment can minimize a separation distance between the first processor chip and the second processor chip disposed on the circuit board due to the characteristics of the second substrate layer. Accordingly, the embodiment can minimize the loss of signals transmitted between the first processor chip and the second processor chip, thereby improving product reliability.

In addition, in an embodiment, sizes of a first circuit pattern and a first via of a first substrate layer can be greater than sizes of a second circuit pattern and a second via of a second substrate layer. Specifically, a first insulating layer constituting the first substrate layer includes a prepreg, and a second insulating layer constituting the second substrate layer includes a PID. Accordingly, the sizes of the second circuit pattern and the second via included in the second substrate layer can be smaller than the sizes of the first circuit pattern and the first via included in the first substrate layer. At this time, in the embodiment, the width of the second vias included in the second substrate layer increases as it approaches the first substrate layer, and decreases as it moves away from the first substrate layer. Accordingly, the embodiment can minimize the transmission loss of the signal transmitted from the second substrate layer to the first substrate layer, and thereby improve communication performance.

In addition, the embodiment can mount a plurality of processor chips side by side on one substrate, and thus the thickness of the semiconductor package can be significantly reduced compared to the comparative example.

In addition, the embodiment can provide a semiconductor package with improved reliability by mounting both a plurality of processor chips and a memory chip on one substrate.

In addition, since the connection of a plurality of circuit boards is not required to connect a plurality of processor chips and memory chips, the embodiment can improve the convenience of the process and the reliability of the electrical connection.

On the other hand, when the circuit board having the above-described characteristics of the invention is used in an IT device or home appliance such as a smart phone, a server computer, a TV, and the like, functions such as signal transmission or power supply can be stably performed. For example, when the circuit board having the features of the present invention performs a semiconductor package function, it can function to safely protect the semiconductor chip from external moisture or contaminants, or alternatively, it is possible to solve problems of leakage current, electrical short circuit between terminals, and electrical opening of terminals supplied to the semiconductor chip. In addition, when the function of signal transmission is in charge, it is possible to solve the noise problem. Through this, the circuit board having the above-described characteristics of the invention can maintain the stable function of the IT device or home appliance, so that the electrical/electronic product and the circuit board to which the present invention is applied can achieve functional unity or technical interlocking with each other.

When the circuit board having the characteristics of the invention described above is used in a transport device such as a vehicle, it is possible to solve the problem of distortion of a signal transmitted to the transport device, or alternatively, the safety of the transport device can be further improved by safely protecting the semiconductor chip that controls the transport device from the outside and solving the problem of leakage current or electrical short between terminals or the electrical opening of the terminal supplied to the semiconductor chip. Accordingly, the transportation device and the circuit board to which the present invention is applied can achieve functional integrity or technical interlocking with each other. Furthermore, when the circuit board having the above-described characteristics of the invention is used in a transportation device such as a vehicle, it is possible to transmit a high-current signal required by the vehicle at a high speed, thereby improving the safety of the transportation device. Furthermore, the circuit board and the semiconductor package including the same can be operated normally even in an unexpected situation occurring in various driving environments of the transportation device, thereby safely protecting the driver.

Features, structures, effects, etc. described in the above embodiments are included in at least one embodiment, and it is not necessarily limited to only one embodiment. Furthermore, features, structures, effects, etc. illustrated in each embodiment can be combined or modified for other embodiments by those of ordinary skill in the art to which the embodiments belong. Accordingly, the contents related to such combinations and variations should be interpreted as being included in the scope of the embodiments.

In the above, the embodiment has been mainly described, but this is only an example and does not limit the embodiment, and those of ordinary skill in the art to which the embodiment pertains will appreciate that various modifications and applications not illustrated above are possible without departing from the essential characteristics of the present embodiment. For example, each component specifically shown in the embodiment can be implemented by modification. And the differences related to these modifications and applications should be interpreted as being included in the scope of the embodiments set forth in the appended claims.

What is claimed is:

1. A circuit board comprising:
   a first insulating layer;
   a second insulating layer including a photocurable insulating material disposed on an upper surface of the first insulating layer, the second insulating layer made of a material different from the first insulating layer;
   a first via electrode disposed to pass through at least a portion of the first insulating layer; and
   a second via electrode disposed to pass through at least a portion of the second insulating layer and overlapping the first via electrode in a vertical direction,
   wherein the first via electrode has a slope in which a horizontal width gradually increases along a vertical direction from an upper surface of the first via electrode to a lower surface of the first via electrode,
   wherein the second via electrode has a slope in which a horizontal width gradually decreases along a vertical direction from an upper surface of the second via electrode to a lower surface of the second via electrode,
   wherein the first via electrode has a greatest horizontal width at the lower surface of the first via electrode, and the second via electrode has a greatest horizontal width at the upper surface of the second via electrode, and
   wherein a horizontal width of the lower surface of the first via electrode is different from a horizontal width of the upper surface of the second via electrode.

2. The circuit board of claim 1, wherein the horizontal width of the lower surface of the first via electrode is greater than the horizontal width of the upper surface of the second via electrode.

3. The circuit board of claim 1, further comprising:

a plurality of first circuit patterns disposed on a lower surface of the first insulating layer; and a plurality of second circuit patterns disposed on an upper surface of the second insulating layer, wherein a horizontal width of each of the plurality of first circuit patterns or a spacing between the plurality of first circuit patterns is different from a horizontal width of each of the plurality of second circuit patterns or a spacing between the plurality of second circuit patterns.

4. The circuit board of claim 3, wherein the horizontal width of each of the plurality of first circuit patterns or the spacing between the plurality of first circuit patterns is greater than the horizontal width of each of the plurality of second circuit patterns or the spacing between the plurality of second circuit patterns.

5. The circuit board of claim 3, wherein the first insulating layer includes a first-first insulating layer disposed below a lower surface of the second insulating layer, and a first-second insulating layer disposed below a lower surface of the first-first insulating layer, wherein the second insulating layer includes a second-first insulating layer disposed on an upper surface of the first-first insulating layer, and a second-second insulating layer disposed on an upper surface of the second-first insulating layer, wherein the first via electrode includes a first-first via electrode passing through at least a portion of the first-first insulating layer, and a first-second via electrode passing through at least a portion of the first-second insulating layer, and wherein the second via electrode includes a second-first via electrode passing through at least a portion of the second-first insulating layer and a second-second via electrode passing through at least a portion of the second-second insulating layer.

6. The circuit board of claim 5, wherein a thickness of each of the first-first insulating layer and the first-second insulating layer is greater than a thickness of each of the second-first insulating layer and the second-second insulating layer.

7. The circuit board of claim 5, wherein a direction in which a slope of the first-first via electrode is inclined is the same as a direction in which a slope of the first-second via electrode is inclined, and wherein a direction in which a slope of the second-first via electrode is inclined is the same as a direction in which a slope of the second-second via electrode is inclined and different from the direction in which the slopes of each of the first-first via electrode and the first-second via electrode are inclined.

8. The circuit board of claim 5, wherein a horizontal width of each lower surface of the first-first and first-second via electrodes is greater than a horizontal width of each upper surface of the second-first and second-second via electrodes, wherein the horizontal width of the lower surface of the first-first via electrode is different from the horizontal width of the lower surface of the first-second via electrode, and wherein the horizontal width of the upper surface of the second-first via electrode is different from the horizontal width of the upper surface of the second-second via electrode.

9. The circuit board of claim 6, wherein the first-second via electrode is disposed farther away from the second-first via electrode than the first-first via electrode, and wherein the horizontal width of the lower surface of the first-second via electrode is greater than the horizontal width of the lower surface of the first-first via electrode.

10. The circuit board of claim 6, wherein the second-second via electrode is disposed farther away from the first-first via electrode than the second-first via electrode, and wherein the horizontal width of the upper surface of the second-second via electrode is greater than the horizontal width of the upper surface of the second-first via electrode.

11. The circuit board of claim 5, wherein the first circuit pattern includes a first-first circuit pattern disposed on a lower surface of the first-first insulating layer and a first-second circuit pattern disposed on a lower surface of the first-second insulating layer, and wherein the second circuit pattern includes a second-first circuit pattern disposed on an upper surface of the second-first insulating layer and a second-second circuit pattern disposed on an upper surface of the second-second insulating layer.

12. The circuit board of claim 11, wherein a horizontal width or spacing of at least one of the first-first circuit pattern and the first-second circuit pattern is greater than a horizontal width or spacing of at least one of the second-first circuit pattern and the second-second circuit pattern, wherein the horizontal width or spacing of the first-first circuit pattern is different from the horizontal width or spacing of the first-second circuit pattern, and wherein the horizontal width or spacing of the second-first circuit pattern is different from the horizontal width or spacing the second-second circuit pattern.

13. The circuit board of claim 12, wherein the first-second circuit pattern is disposed farther away from the second-first circuit pattern than the first-first circuit pattern, and wherein the horizontal width or the spacing of the first-second circuit pattern is greater than the horizontal width or the spacing of the first-first circuit pattern.

14. The circuit board of claim 13, wherein the second-second circuit pattern is disposed farther away from the first-first circuit pattern than the second-first circuit pattern, and wherein the horizontal width or the spacing of the second-second circuit pattern is smaller than the horizontal width or spacing of the second-first circuit pattern.

15. The circuit board of claim 12, wherein the second insulating layer further includes a second-third insulating layer disposed on an upper surface of the second-second insulating layer, wherein the second circuit pattern further includes a second-third circuit pattern disposed on an upper surface of the second-third insulating layer, wherein the second-second circuit pattern is disposed in a first recess provided at a lower surface of the second-second insulating layer, and wherein the second-third circuit pattern is disposed in a second recess provided at upper surface of the second-third insulating layer.

16. A semiconductor package comprising:

a first insulating layer;

a second insulating layer including a photocurable insulating material disposed on an upper surface of the first insulating layer, the second insulating layer made of a material different from the first insulating layer;

a first via electrode disposed to pass through at least a portion of the first insulating layer; and a second via electrode disposed to pass through at least a portion of the second insulating layer and overlapping the first via electrode in a vertical direction;

a plurality of pads disposed on the second insulating layer and spaced apart in a horizontal direction; and a semiconductor chip disposed on the plurality of pads, wherein the first via electrode has a slope in which a horizontal width gradually increases along a vertical direction from an upper surface of the first via electrode to a lower surface of the first via electrode, wherein the second via electrode has a slope in which a horizontal width gradually decreases along a vertical direction from an upper surface of the second via electrode to a lower surface of the second via electrode, wherein the first via electrode has a greatest horizontal width at the lower surface of the first via electrode, and the second via electrode has a greatest horizontal width at the upper surface of the second via electrode, and wherein a horizontal width of the lower surface of the first via electrode is different from a horizontal width of the upper surface of the second via electrode.

17. The semiconductor package of claim 16, wherein the horizontal width of the lower surface of the first via electrode is greater than the horizontal width of the upper surface of the second via electrode.

18. The semiconductor package of claim 16, wherein a plurality of semiconductor chips are mounted on the plurality of pads and spaced apart in the horizontal direction, and wherein the plurality of semiconductor chips include at least two of a first application processor chip, a second application processor chip, and a memory chip.

* * * * *